(12) United States Patent
Mizutani

(10) Patent No.: US 12,367,931 B2
(45) Date of Patent: Jul. 22, 2025

(54) STACKED COLUMN FLOORPLAN FOR NAND

(71) Applicant: SanDisk Technologies LLC, Addison, TX (US)

(72) Inventor: Yuki Mizutani, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 173 days.

(21) Appl. No.: 18/358,598

(22) Filed: Jul. 25, 2023

(65) Prior Publication Data

US 2024/0274192 A1 Aug. 15, 2024

Related U.S. Application Data

(60) Provisional application No. 63/484,712, filed on Feb. 13, 2023.

(51) Int. Cl.
*G11C 16/04* (2006.01)
*G11C 5/06* (2006.01)
(Continued)

(52) U.S. Cl.
CPC .......... *G11C 16/0483* (2013.01); *G11C 5/063* (2013.01); *H01L 25/0657* (2013.01); *H10B 41/10* (2023.02); *H10B 41/20* (2023.02); *H10B 41/35* (2023.02); *H10B 41/40* (2023.02); *H10B 43/10* (2023.02); *H10B 43/20* (2023.02); *H10B 43/35* (2023.02); *H10B 43/40* (2023.02); *H10B 80/00* (2023.02); *H01L 2225/06506* (2013.01)

(58) Field of Classification Search
CPC . G11C 16/0483; G11C 5/063; H01L 25/0657; H01L 2225/06506; H01L 2225/06541; H01L 2225/06562; H01L 25/18; H10B 41/10; H10B 41/20; H10B 41/35; H10B 41/40; H10B 43/10; H10B 43/20; H10B 43/35; H10B 43/40; H10B 80/00; H10B 41/27; H10B 43/27; H10B 43/50
USPC .......................................................... 365/62
See application file for complete search history.

(56) References Cited

U.S. PATENT DOCUMENTS 8,952,426 B2 2/2015 Maejima
9,202,529 B2 12/2015 Kajigaya
(Continued)

*Primary Examiner* — Fernando Hidalgo
(74) *Attorney, Agent, or Firm* — Pearl Cohen Zedek Latzer Baratz LLP

(57) ABSTRACT

Technology is disclosed herein for memory device with control circuitry having an efficient floorplan. Control circuitry resides in a control semiconductor die that is bonded to a memory die NAND strings extending in a z-direction. The memory die has bit lines extending across the NAND strings in an x-direction. First column control circuitry is connected to and configured to control a first set of bit lines. Second column control circuitry is connected to and configured to control a second set of bit lines. The second column control circuitry is stacked in an x-direction with the first column control circuitry. The control die also has system control circuitry configured to control the first column control circuitry and the second column control circuitry. The system control circuitry resides in the floorplan beside the stacked column control circuitry to allow for additional routing of electrical connections above the system control circuitry.

20 Claims, 24 Drawing Sheets

(51) Int. Cl.
*H01L 25/065* (2023.01)
*H10B 41/10* (2023.01)
*H10B 41/20* (2023.01)
*H10B 41/35* (2023.01)
*H10B 41/40* (2023.01)
*H10B 43/10* (2023.01)
*H10B 43/20* (2023.01)
*H10B 43/35* (2023.01)
*H10B 43/40* (2023.01)
*H10B 80/00* (2023.01)

(56) References Cited

U.S. PATENT DOCUMENTS

| | | |
|---|---|---|
| 10,026,747 B2 | 7/2018 | Hwang et al. |
| 11,081,474 B1 * | 8/2021 | Hoang ................... G11C 16/26 |
| 11,222,881 B2 | 1/2022 | Zhang et al. |
| 2021/0397372 A1 * | 12/2021 | Sravan ................... H10B 43/10 |
| 2022/0077128 A1 | 3/2022 | Chiba et al. |
| 2023/0187413 A1 * | 6/2023 | Yoshihara ........... H01L 25/0657 257/777 |
| 2023/0309307 A1 * | 9/2023 | Baek ...................... H10B 43/10 |

* cited by examiner

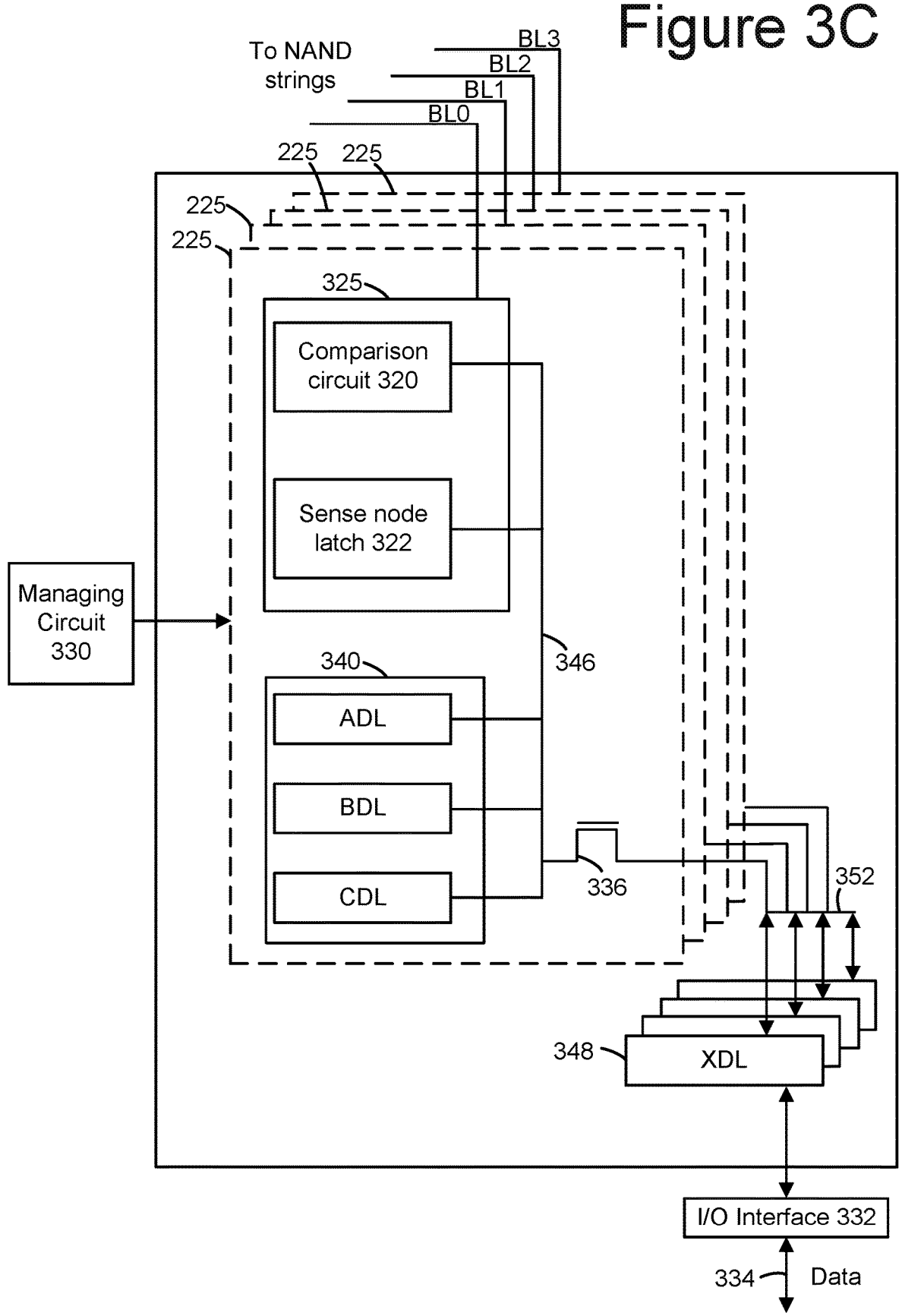

STACKED COLUMN FLOORPLAN FOR NAND

CLAIM OF PRIORITY

The present application claims priority from U.S. Provisional Patent Application No. 63/484,712, entitled "STACKED COLUMN FLOORPLAN FOR NAND," by Mizutani, filed Feb. 13, 2023, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional (3D). One type 3D memory structure has non-volatile memory cells arranged as vertical NAND strings (where "vertical" is defined with respect to a substrate on which the 3D memory structure is formed). The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The memory system typically has column control circuitry to operate the bit lines and row control circuitry to operate the word lines. The column control circuitry may include bit line voltage drivers, column decoders, and read/write circuits. The row control circuitry may include word line voltage drivers and row decoders. The memory system typically has additional circuitry to perform function such as generating voltages and controlling the memory operations at the die level. The die level control includes controlling the voltages applied to the bit lines, word lines, and other control lines, as well as controlling the sense amplifiers. The control circuitry will typically occupy a substantial amount of space on a semiconductor die.

There are electrical connections between the column control circuitry and the bit lines, as well as electrical connections between the row control circuitry and the rows (e.g., word lines and select lines). Routing the electrical connections presents challenges. FIG. 1 depicts a conventional floorplan for a semiconductor die 10 that contains circuitry for die level control of operations in a memory structure. In this example, the memory structure has four planes. The circuitry is divided into four units 20(1), 20(2), 20(3), 20(4). Each unit 20 has row control circuitry 22, column control circuitry 24, and peripheral circuitry 26. Unit 20(1) has row control circuitry 22(1a), 22(1b), column control circuitry 24(1) and peripheral circuitry 26(1); unit 20(2) has row control circuitry 22(2a), 22(2b), column control circuitry 24(2) and peripheral circuitry 26(2); unit 20(3) has row control circuitry 22(3a), 22(3b), column control circuitry 24(3) and peripheral circuitry 26(3); and unit 20(4) has row control circuitry 22(4a), 22(4b), column control circuitry 24(4) and peripheral circuitry 26(4). An input/output area 18 has an interface for exchanging data with a host. The input/output area 18 also has pads or the like for receiving power (e.g., Vdd, Vcc, etc.). Arrow 30 represents pathways for transferring signals and/or voltages between the I/O area 18 and peripheral circuitry 26(1). Arrow 32 represents pathways (above the circuitry) for transferring signals and/or voltages between peripheral circuitry 26(3) and peripheral circuitry 26(1). Arrow 34 represents pathways for transferring signals and/or voltages between the I/O area 18 and peripheral circuitry 26(2). Arrow 36 represents pathways for transferring signals and/or voltages between peripheral circuitry 26(4) and peripheral circuitry 26(2). Note that arrows 30, 32 cross above column control circuitry 24(3). Likewise, arrows 34, 36 cross above column control circuitry 24(4). The foregoing issue may lead to routing issues. These issues may lead to an increase in die size and additional cost.

BRIEF DESCRIPTION OF THE DRAWINGS

Like-numbered elements refer to common components in the different figures.

FIG. 3C is a block diagram depicting one embodiment of a portion of column control circuitry that contains a number of read/write circuits.

DETAILED DESCRIPTION

Technology is disclosed herein for memory device with control circuitry having an efficient floorplan. In an embodiment, the control circuitry resides in a control semiconductor die that is bonded to a memory die having NAND strings extending in a z-direction. The memory die has bit lines extending across the NAND strings in an x-direction. In an embodiment the control circuitry has column control circuitry that is connected to and configured to operate the bit lines. In an embodiment, the column control circuitry has first column control circuitry connected to and configured to control a first set of bit lines in the plane and second column control circuitry connected to and configured to control a second set of bit lines in the plane. The second column control circuitry is stacked in an x-direction with the first column control circuitry. The control die also has system control circuitry configured to control the first column control circuitry and the second column control circuitry. In an embodiment, the system control circuitry resides in the floorplan beside the stacked column control circuitry. The floorplan allows for additional routing of electrical connections above the system control circuitry. Therefore, the floorplan saves cost and reduces the size of the control die.

Note that the second set of bit lines may reside in an x-y region of the memory die that is "above" the system control circuitry in the control die. Herein, the control die will by definition be referred to as "below" the memory die. Thus, the control circuitry in the "floorplan" is considered to be below the bit lines and the memory cells. Moreover, the terms "above", "below", or the like, as defined herein mean to cover common x-y positions, but a different z-position. In one embodiment, the electrical connections between the second column control circuitry and the second set of bit lines have bit line bridges in a metal layer of the memory die adjacent to the bit lines. The bit line bridges each have a segment that extends in the memory die above the system control circuitry. Therefore, the electrical connections between the second column control circuitry and the second set of bit lines can be made without routing in the control die above the system control circuitry, which leaves more room in the control die above the system control circuitry for other routing. Therefore, the floorplan saves cost and reduces the size of the control die.

Figure 2A:
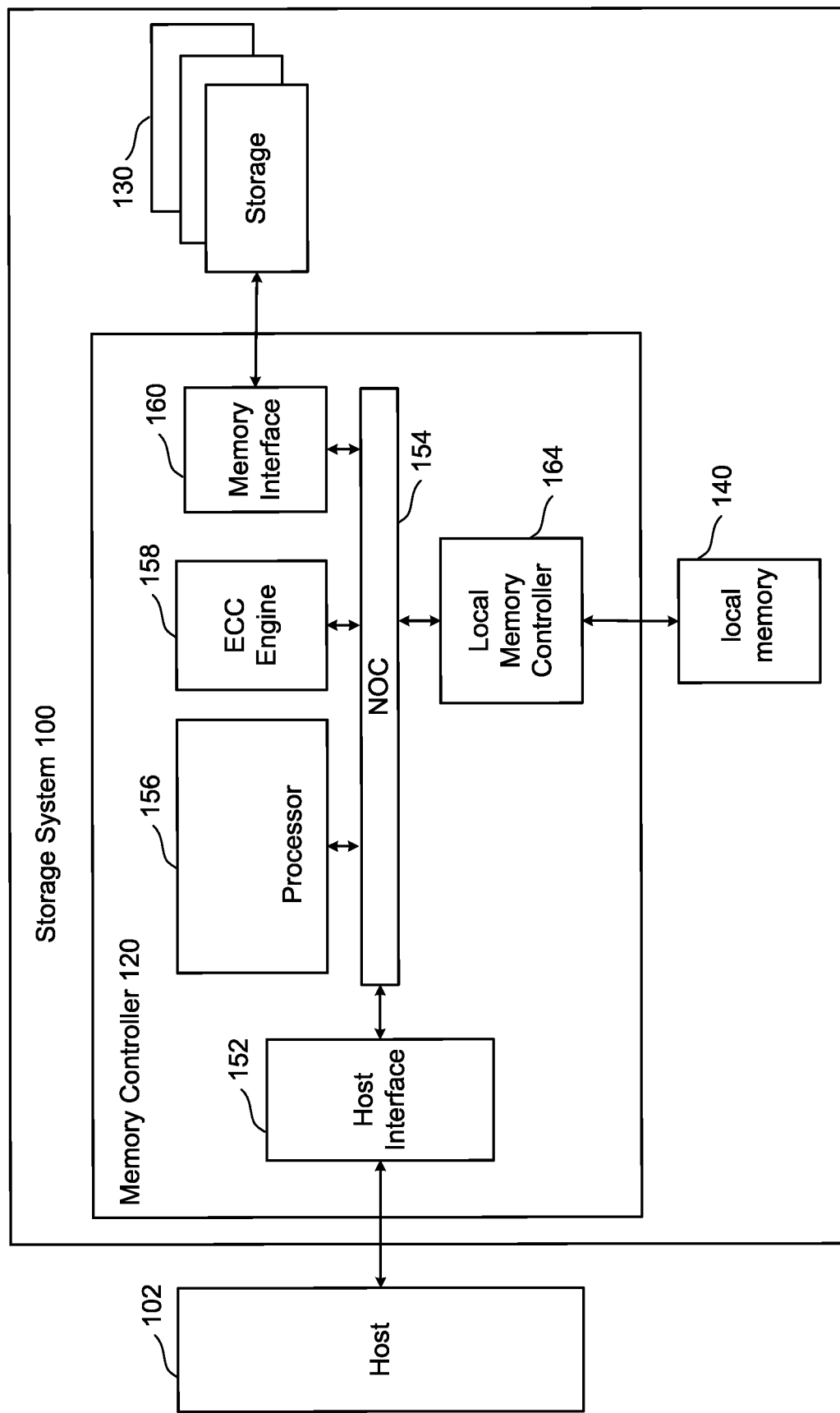
FIG. 2A is a block diagram depicting one embodiment of a storage system.

FIG. 2A is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102. In some embodiments, the technology described herein is implemented within a portion of the storage system 100, such as in storage 130.

Figure 1:
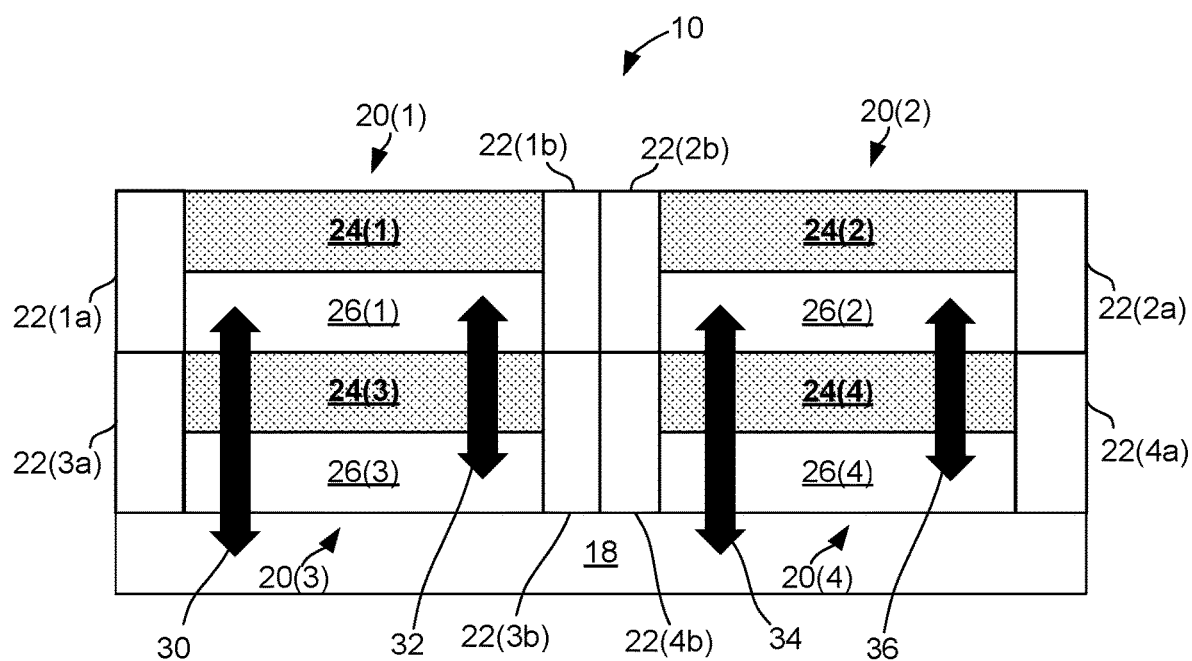
FIG. 1 depicts a conventional floorplan for a semiconductor die that contains circuitry for die level control of operations in a memory structure.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. An elevated level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2B:
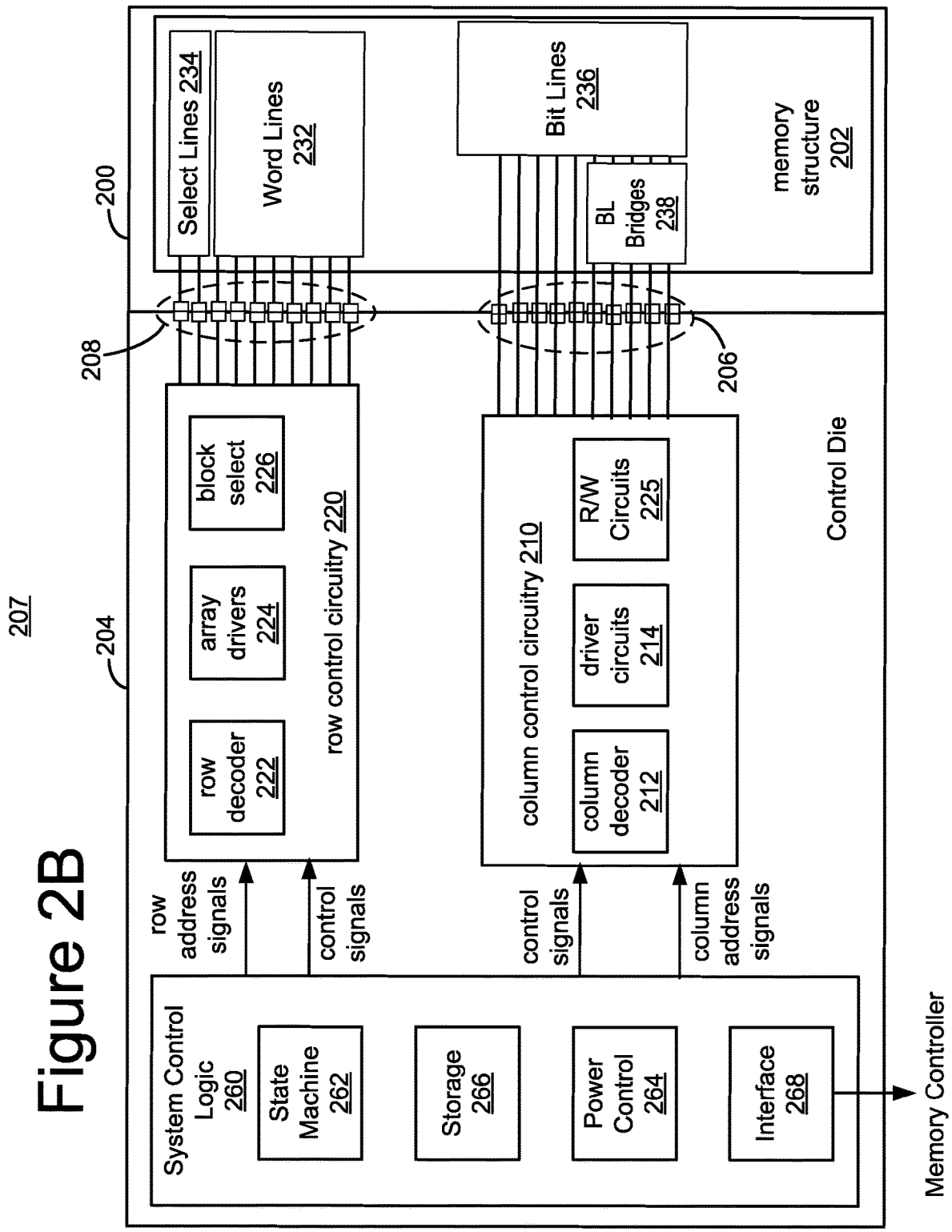
FIG. 2B is a block diagram of one embodiment of an integrated memory assembly.

In one embodiment, non-volatile storage 130 comprises one or more memory dies. FIG. 2B shows an arrangement which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 200 (or more succinctly "memory die") includes memory structure 202. Memory structure 202 includes non-volatile memory cells. Control die 204 includes control circuitry 260, 210, and 220. The control die 204 may also be referred to as a "logic die" or a "CMOS die". In some embodiments, the memory structure die 200 and the control die 204 are bonded together.

The components depicted in FIG. 2B are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines 232 organized as rows, select lines 234, and the various layer(s) of bit lines 236 organized as columns. However, other orientations can also be implemented. Control die 204 includes row control circuitry 220, whose outputs are connected to respective word lines 234 and select lines 234 of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Memory die 200 also includes column control circuitry 210 including read/write circuits 225. The read/write circuits 225 may contain sense amplifiers and data latches. The sense amplifier(s) input/outputs are connected to respective bit lines 236 of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Note that the locations of the system control logic 260, row control circuitry 220 and column control circuitry 210 depicted in FIG. 2B does not necessarily reflect the floorplan of the control die 204. Further details of the floorplan of the control die 204 are discussed below.

Commands and data are transferred between memory controller 120 and control die 204 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

Note that in FIG. 2B the memory structure 202 resides on one die (referred to as the memory die) and some or all of the peripheral circuitry elements, including one or more control circuits, reside on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 200 may reduce the number of steps needed to fabricate such a die, adding such circuits to a die such as control die 204 may not require many additional process steps. The control die 204 could also be referred to as a CMOS die, due to the use of CMOS technology to implement some or all of control circuitry 260, 210, 220.

The two die 200, 204 can be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example. The bonds includes a first set of bonds 208 and a second set of bonds 206. The first set of bonds 208 form part of the electrical pathways between the row control circuitry 220 and the rows (e.g., word lines 232, select lines 234). The second set of bonds 206 form part of the electrical pathways between the column control circuitry 210 and the bit lines 236. In an embodiment, the memory die 200 has bit line (BL) bridge structures 238, which may reside in a metal layer in the memory die 200. The BL bridge structures 238 form part of the electrical pathways between some of the column control circuitry 210 and some of the bit lines 236. However, BL bridge structures 238 are not used in the electrical pathways between the rest of the column control circuitry 210 and the rest of the bit lines 236. Further details of the BL bridge structures 238 are discussed below. Note that each bit line 236 of memory structure 202 may have a corresponding electrical path, including a pair of bond pads 206, which connects to column control circuitry 210.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 204.

Figure 3A:
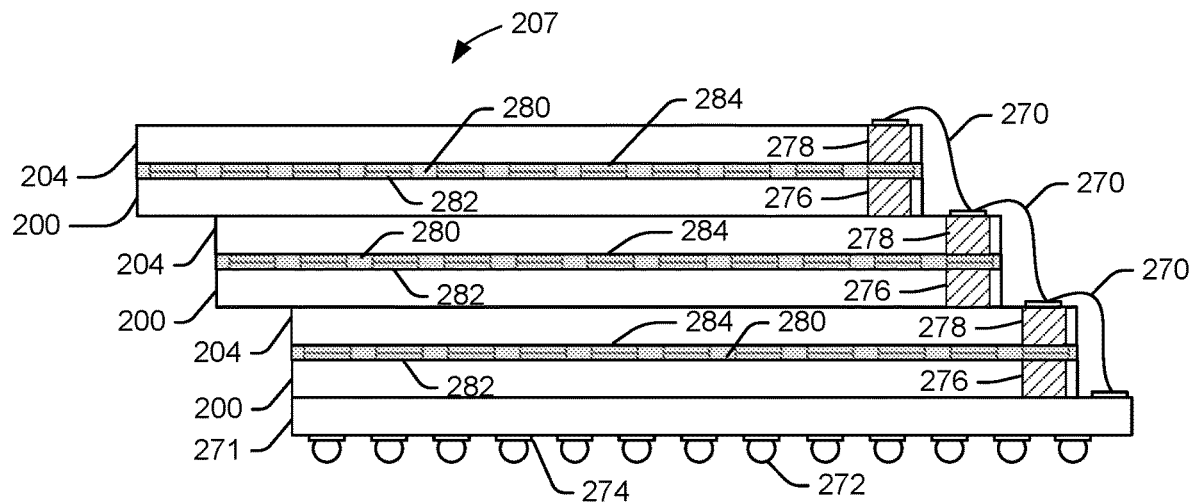
FIGS. 3A and 3B depict different embodiments of integrated memory assemblies.

In some embodiments, there is more than one control die 204 and more than one memory structure die 200 in an integrated memory assembly 207. In some embodiments, the integrated memory assembly 207 includes a stack of multiple control dies 204 and multiple memory structure dies 200. FIG. 3A depicts a side view of an embodiment of an integrated memory assembly 207 stacked on a substrate 271 (e.g., a stack comprising control die 204 and memory structure die). The integrated memory assembly 207 has three control dies 204 and three memory structure dies 200. In some embodiments, there are more than three memory structure dies 200 and more than three control dies 204. In FIG. 3A there are an equal number of memory structure dies 200 and control dies 204; however, in one embodiment, there are more memory structure dies 200 than control dies 204. For example, one control die 204 could control multiple memory structure dies 200.

Each control die 204 is affixed (e.g., bonded) to at least one of the memory structure die 200. Some of the bond pads 282/284 are depicted. There may be many more bond pads. A space between two die 200, 204 that are bonded together is filled with a solid layer 280, which may be formed from epoxy or other resin or polymer. This solid layer 280 protects the electrical connections between the die 200, 204, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 204 to the substrate 271. A number of such wire bonds may be formed across the width of each control die 204 (i.e., into the page of FIG. 3A).

A memory die through silicon via (TSV) 276 may be used to route signals through a memory structure die 200. A control die through silicon via (TSV) 278 may be used to route signals through a control die 204. The TSVs 276, 278 may be formed before, during or after formation of the integrated circuits in the semiconductor dies 200, 204. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
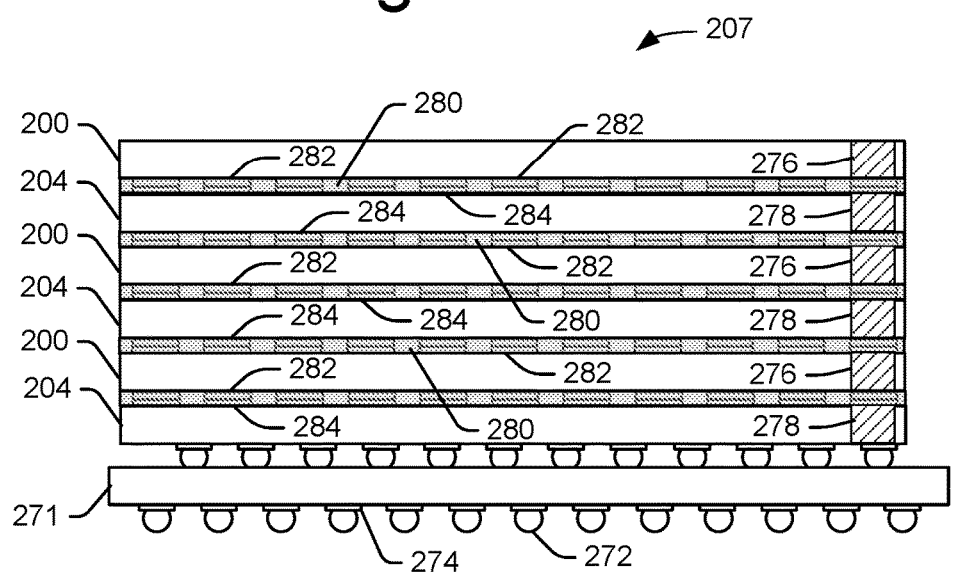

FIG. 3B depicts a side view of another embodiment of an integrated memory assembly 207 stacked on a substrate 271. The integrated memory assembly 207 of FIG. 3B has three control dies 204 and three memory structure dies 200. In some embodiments, there are many more than three memory structure dies 200 and many more than three control dies 204. In this example, each control die 204 is bonded to at least one memory structure die 200. Optionally, a control die 204 may be bonded to two or more memory structure dies 200.

Some of the bond pads 282, 284 are depicted. There may be many more bond pads. A space between two dies 200, 204 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 200. A control die through silicon via (TSV) 278 may be used to route signals through a control die 204.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 204 and the memory structure die 200 may be bonded together. Bond pads on each die 200, 204 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 200, 204. Where no such film is initially provided, a space between the die may be under filled with an epoxy or other resin or polymer. The under-fill material may be applied as a liquid which then hardens into a solid layer. This under-fill step protects the electrical connections between the dies 200, 204, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a plurality of sense amplifiers 325 and data latches 340. A managing circuit 330 controls the read/write circuits 225. The managing circuit 330 may communicate with state machine 262. In one embodiment, each sense amplifier 325 is connected to a respective bit line. Each bit line may be connectable, at one point in time, to one of a large number of different NAND strings. A select gate on the NAND string may be used to connect the NAND string channel of one of the NAND strings to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the reference voltage. If the sense node voltage does not decay below Vtrip, the memory cell is in a non-conductive state and its Vth is above the reference voltage. A sense node latch 322 is set to 0 or 1, for example, by the comparison circuit 320 based on whether the memory cell is in a conductive or non-conductive state, respectively.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340. The sense amplifier 325 is able to control the magnitude of the voltage on the bit line during sensing.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells has been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate. However, in some embodiments, verify is not performed. If verify is not performed, memory cells may still be locked out after a pre-determined number of pulse have been applied to the cell given the target data state.

Figure 4:
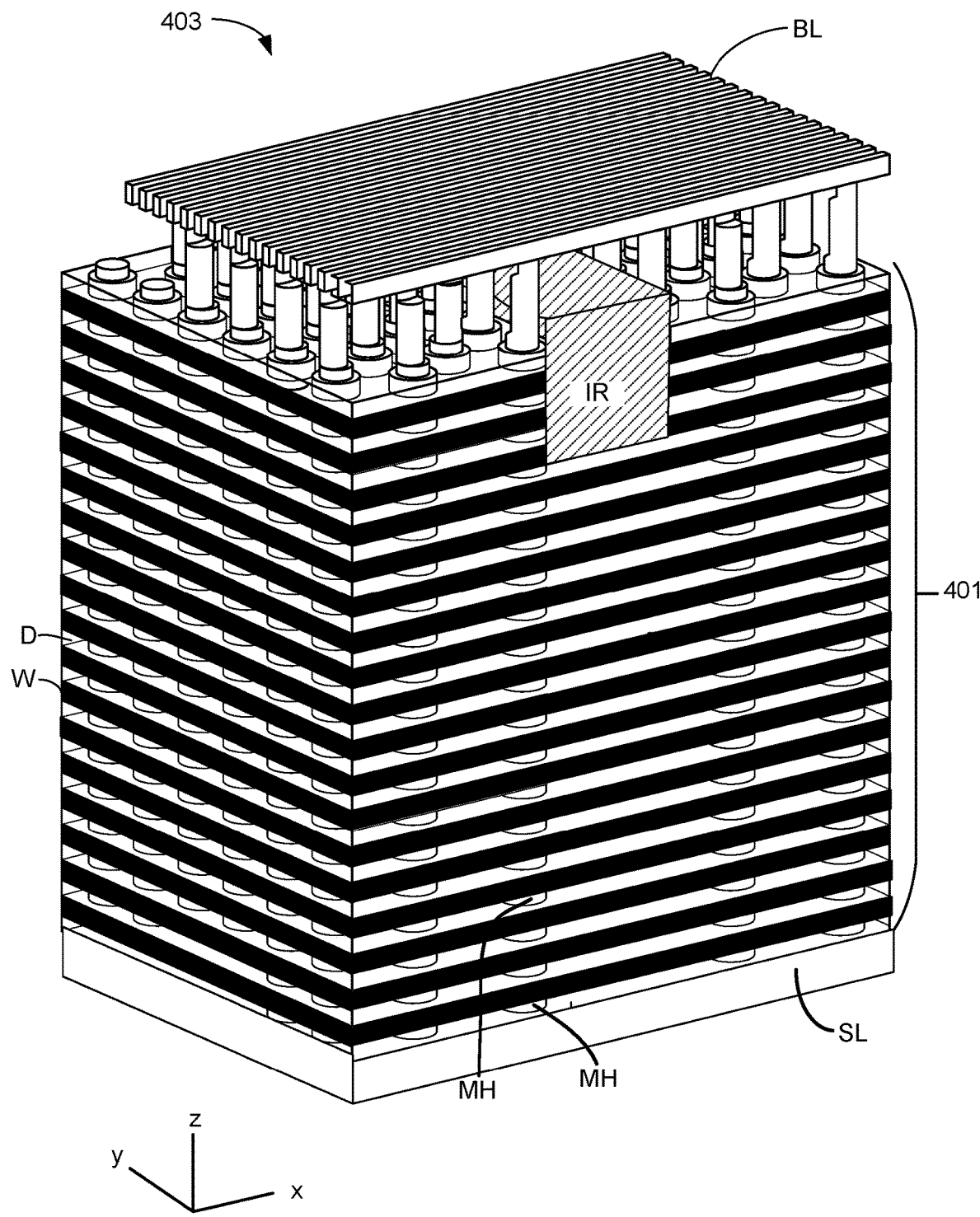
FIG. 4 is a perspective view of a portion of one example embodiment of a monolithic three-dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 403 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
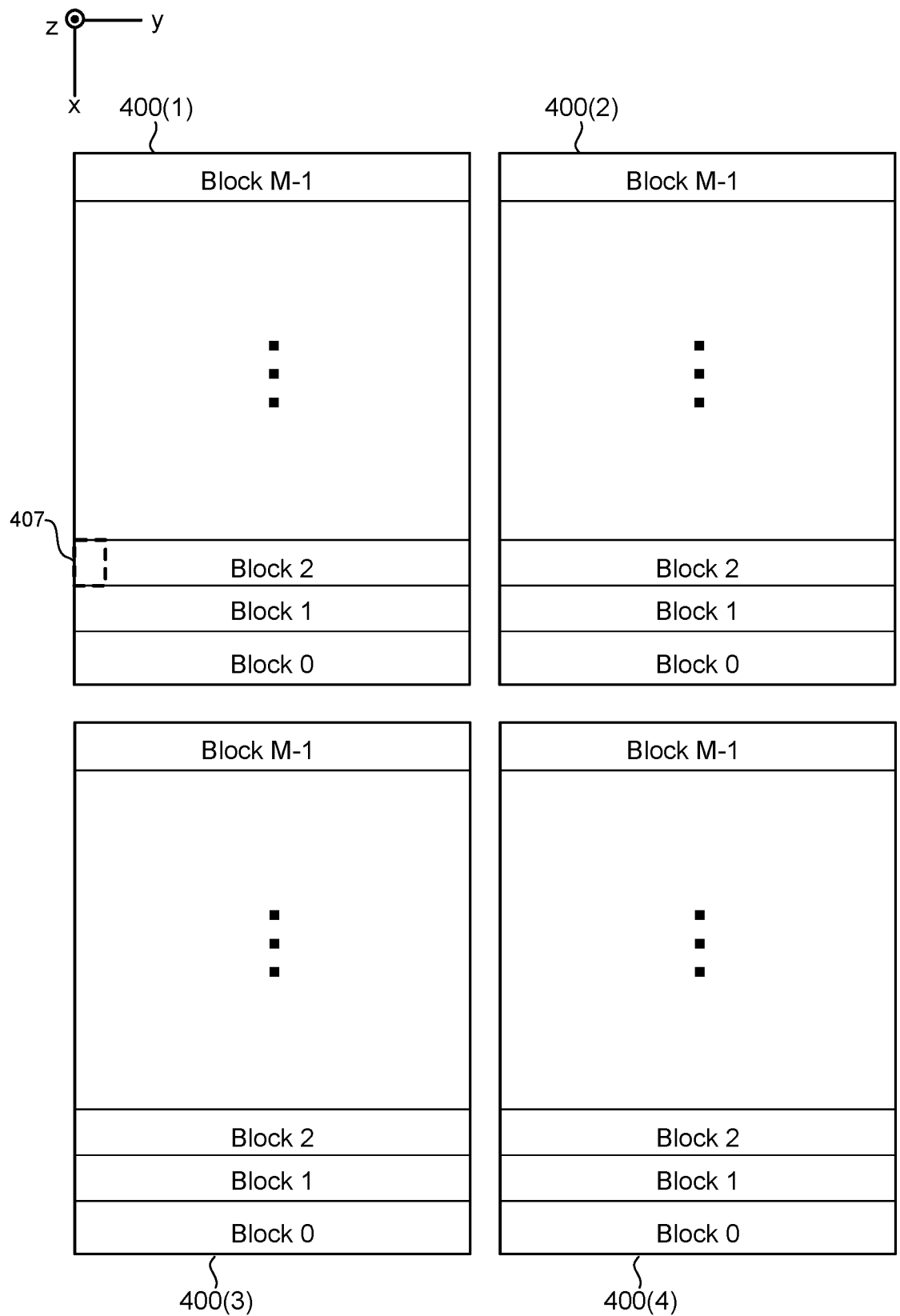
FIG. 4A is a block diagram of one embodiment of a memory structure having four planes.

FIG. 4A is a block diagram explaining one example organization of memory structure 202, which is divided into four planes 400(0), 400(1), 400(2), 400(3). Each plane 400 is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows four planes 400, more or fewer than four planes can be implemented.

Figure 4B:
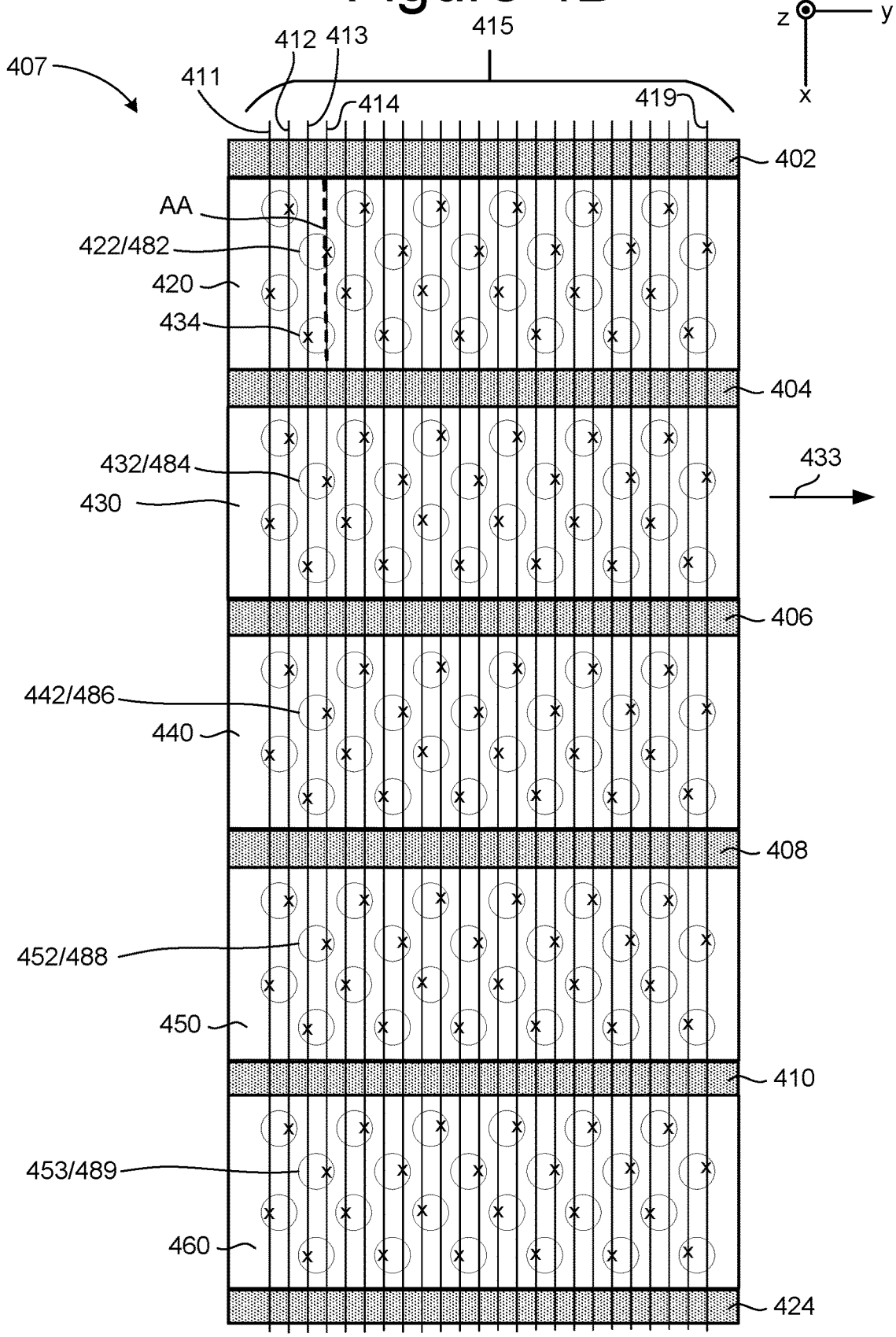
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIG. 2B. FIG. 4B is a block diagram depicting a top view of a portion 407 of Block 2 of plane 400(0). As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452, and 453. Vertical column 422 implements NAND string 482. Vertical column 432 implements NAND string 484. Vertical column 442 implements NAND string 486. Vertical column 452 implements NAND string 488. Vertical column 453 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which are formed of SiO$_2$; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408 or 410. In one example implementation, a bit line only connects to one vertical column/NAND string in each of regions (sub-blocks) 420, 430, 440, 450 and 460. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
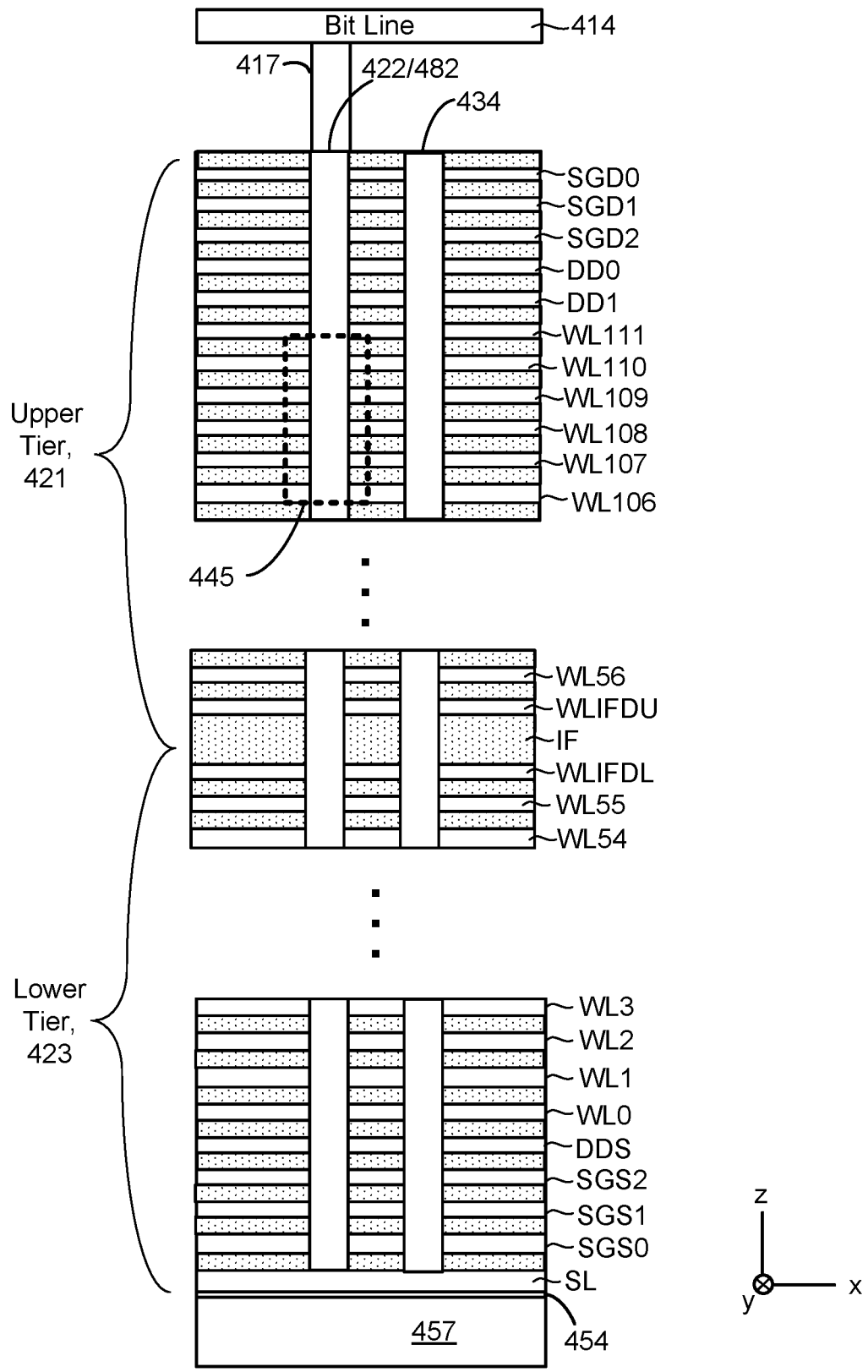
FIG. 4C depicts an embodiment of a stack showing a cross-sectional view along line AA of FIG. 4B.

FIG. 4C depicts a portion of one embodiment of a three dimensional memory structure 202 showing a cross-sectional view along line AA of FIG. 4B. This cross sectional view cuts through vertical columns (NAND strings) 422 and 434 of region 420 (see FIG. 4B). The structure of FIG. 4C includes three drain side select gate layers (SGD0, SGD1 and SGD2). The structure of FIG. 4C also includes three source side select gate layers (SGS0, SGS1 and SGS2). The structure of FIG. 4C also includes five dummy word line layers DD0, DD1, WLIFDU, WLIDDL, DDS; one hundred twelve word line layers WL0-WL111 for connecting to data memory cells. Dielectric layers are depicted between the conductive layers just described. Other embodiments can implement more or fewer than the numbers described above for FIG. 4C. In one embodiment, SGD0, SGD1 and SGD2 are electrically connected together; and SGS0, SGS1 and SGS2 are electrically connected together.

FIG. 4C depicts an embodiment of a stack having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Vertical columns 422 and 434 are depicted protruding through the drain side select layers, source side select layers, IF layer, dummy word line layers and word line layers. In one embodiment, each vertical column comprises a vertical NAND string. Below the vertical columns and the layers listed below is substrate 457, an insulating film 454 on the substrate, and source line SL. The NAND string of vertical column 422 has a source end at a bottom of the stack and a drain end at a top of the stack. As in agreement with FIG. 4B, FIG. 4C show vertical column 422 connected to bit line 414 via connector 417.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W111 connect to memory cells (also called data memory cells). Dummy word line layers DD0, DD1 and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 4D:
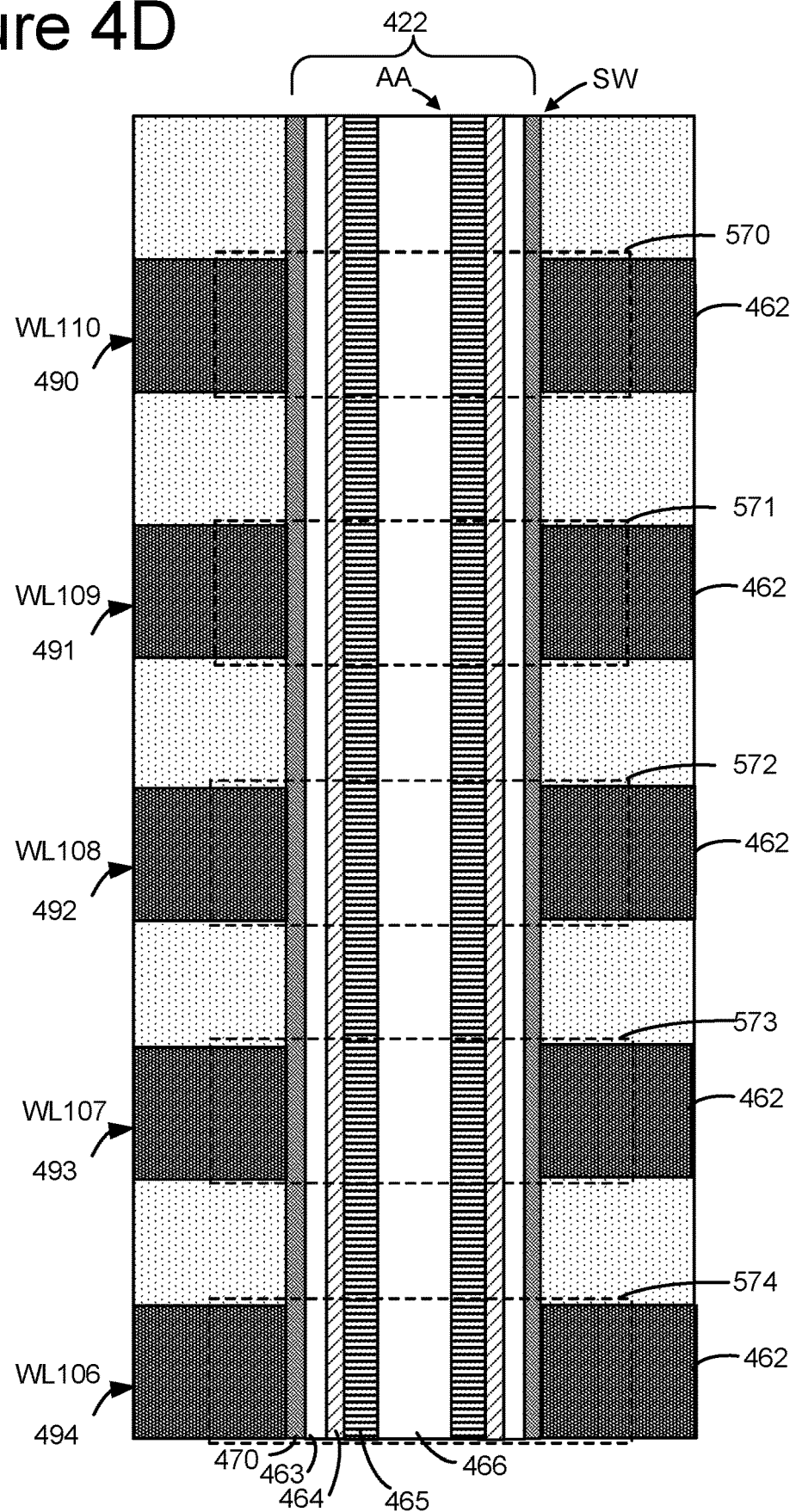
FIG. 4D depicts a view of the region 445 of FIG. 4C.

FIG. 4D depicts a view of the region 445 of FIG. 4C. Included are WL106-110 and dielectric layers between the word line layers. Data memory cell transistors 570, 571, 572, 573, and 574 are indicated by the dashed lines. A number of layers can be deposited along the sidewall (SW) of the memory hole 422 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
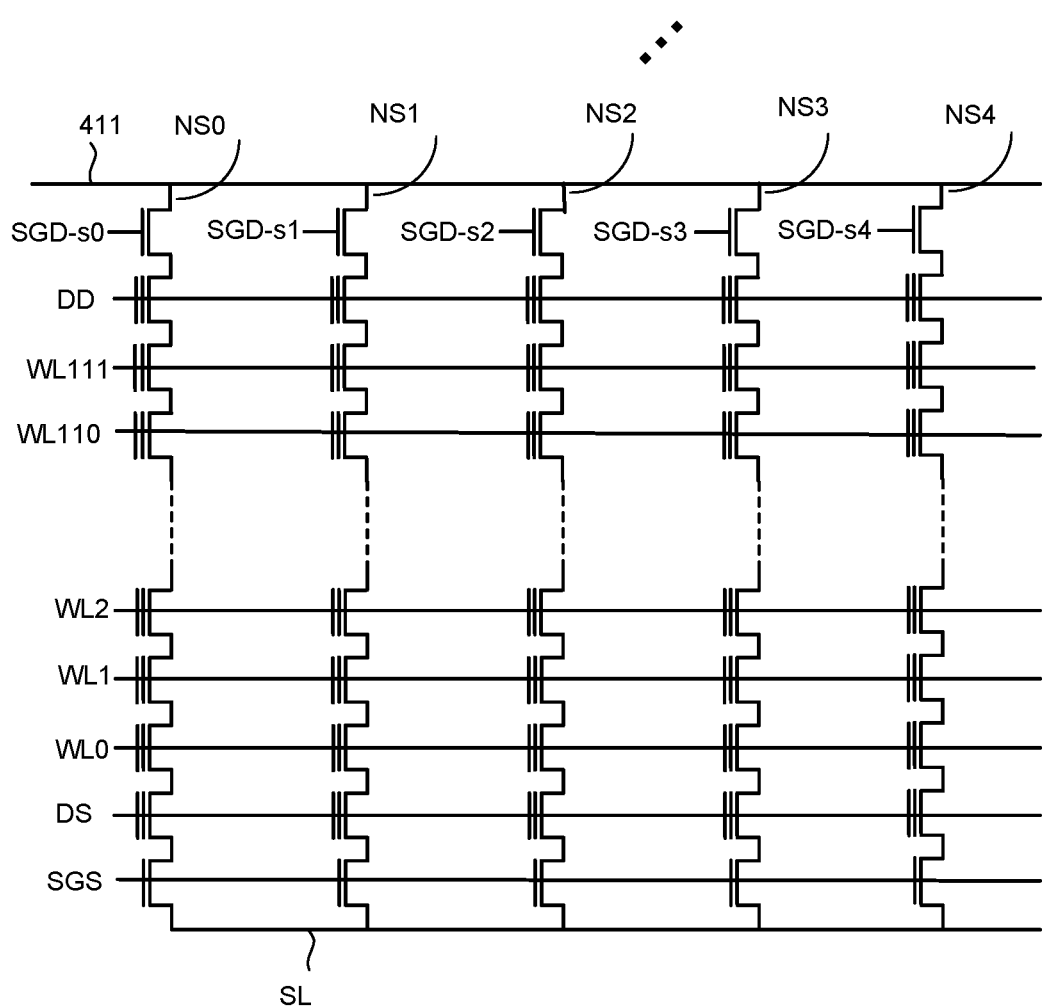
FIG. 4E is a schematic diagram of a portion of one embodiment of a block, depicting several NAND strings.

FIG. 4E is a schematic diagram of a portion of the memory depicted in in FIGS. 4-4D. FIG. 4E shows physical word lines WL0-WL111 running across the entire block. The structure of FIG. 4E corresponds to portion 407 in Block 2 of FIGS. 4A-4B, including bit lines 411, 412, 413, 414, . . . . 419. Within the block, each bit line is connected to five NAND strings. Drain side selection lines SGD-s0, SGD-s1, SGD-s2, SGD-s3 and SGD-s4 are used to determine which of the five NAND strings (NS0, NS1, NS2, NS3, NS4) connect to the associated bit line. Other NAND strings of the block and other bit lines are not depicted in FIG. 4E. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block. FIG. 4E shows that SGD select line connects to an SGD transistor on one of the NAND strings. There are many other NAND strings in the block that are not depicted in FIG. 4E. Each SGD select line will connect to all of the NAND strings on one sub-block. The SGD transistor may be used to connect/disconnect the NAND string channel to/from the bit line.

A source side selection line SGS connects/disconnects the NAND strings to/from the common source line. In some embodiments, there is a source side selection line for each sub-block (similar to the five SGD-s0, SGD-s1, SGD-s2, SGD-s3 and SGD-s4). The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Although the example memories of FIGS. 4-4E are three dimensional memory structure that includes vertical NAND strings with charge-trapping material, other (2D and 3D) memory structures can also be used with the technology described herein.

Figure 5A:
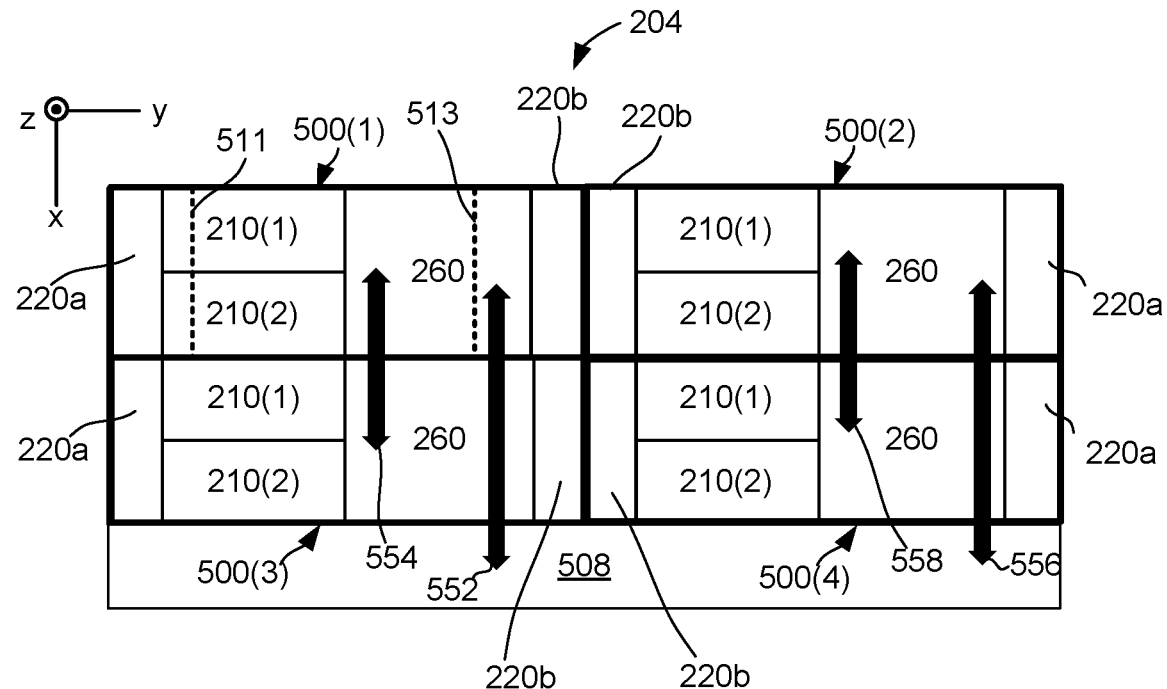
FIG. 5A depicts the floorplan of one embodiment of control circuitry in a control die.

FIG. 5A depicts the floorplan of one embodiment of control circuitry in a control die 204. The term "floorplan" means the x-y location (see coordinates in FIG. 5A) of circuitry in the control die 204. The floorplan is divided into four units 500(1), 500(2), 500(3) and 500(4). There is also an I/O region 508. Each unit 500 has row control circuitry 220, column control circuitry 210, and system control logic 260. The column control circuitry 210 of each unit is divided into first column control circuitry 210(1) and second column control circuitry 210(2). In an embodiment, first column control circuitry 210(1) is used to control a first set of bit lines and second column control circuitry 210(2) is used to control a second set of bit lines. In an embodiment, BL bridges 238 are used in the electrical pathways between the second column control circuitry 210(2) and the second set of bit lines. However, BL bridges 238 are not needed in the electrical pathways between the first column control circuitry 210(1) and the first set of bit lines. The row control circuitry 220 of each unit is divided into outer row control circuitry 220a and inner row control circuitry 220b; however, other configurations are possible for the row control circuitry 220.

For purpose of discussion an example will be discussed in which the memory die 200 has four planes, consistent with the number and arrangement depicted in FIG. 4A. In FIG. 4A, the four planes are arranged in a 2×2 configuration; however, arrangements other than 2×2 may be used. In an embodiment, the x-y region occupied by unit 500(1) corresponds to the x-y region (i.e., has essentially the same x-y coordinates) occupied by plane 400(1); the x-y region occupied by unit 500(2) corresponds to the x-y region occupied by plane 400(2); the x-y region occupied by unit 500(3) corresponds to the x-y region occupied by plane 400(3); and the x-y region occupied by unit 500(4) corresponds to the x-y region occupied by plane 400(4).

Figure 5B:
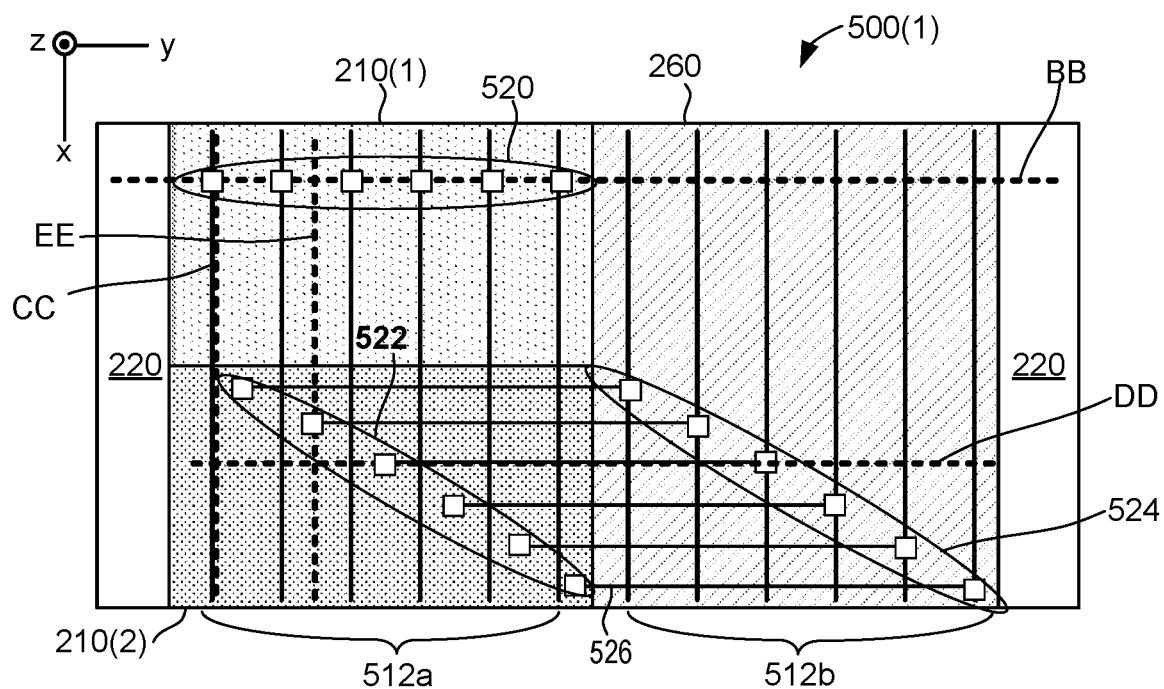
FIG. 5B depicts further details of one embodiment of unit 500(1) in FIG. 5A.

FIG. 5B depicts further details of one embodiment of unit 500(1) from FIG. 5A. Bit lines 512 are also depicted to show the relative locations of the bit lines in the x-y dimension. Note that the bit lines are located in the memory die 200, whereas the circuitry of floorplan is in the control die 204. There are a first set of BLs 512a and a second set of BLs 512b. A total of 12 bit lines are depicted in FIG. 5B. Each bit line extends in the x-direction. The bit lines 512 in FIG. 5B are representative of the bit lines of one plane 400 in the memory die 200. There will be many more bit lines. The bit lines 512 span across an x-y region in the memory die 200 that is above the x-y region of the floorplan in the control die 204. The first column control circuitry 210(1) is connected to and used to operate the first set of BLs 512a. The second column control circuitry 210(1) is connected to and used to operate the second set of BLs 512b.

Note that the column control circuitry 210 does not extend in the y-direction across the entire set of bit lines 512. Instead the column control circuitry 210 is divided into first column control circuitry 210(1) that is stacked in the x-direction with second column control circuitry 210(2). By being "stacked in the x-direction" it is meant that along a particular line in the x-direction within a given unit 500 a first segment of the line will cross the first column control circuitry 210(1) and a second segment of the line will cross the second column control circuitry 210(2). Dashed line 511 in FIG. 5A shows how the first column control circuitry 210(1) and the second column control circuitry 210(2) are stacked in unit 500(1). Moreover, the first column control circuitry 210(1) extends over a first x-extent that does not overlap with a second x-extent over which the second column control circuitry 210(1) extends. In other words, no portion of the first column control circuitry 210(1) in a given unit 500 shares an x-coordinate with the second column control circuitry 210(2) in that unit 500.

The first column control circuitry 210(1) extends over a first x-y region that is a subset of the x-y region over which the bit lines 512 span. The second column control circuitry 210(2) extends over a second x-y region that is a different subset of the x-y region over which the bit lines 512 span.

The system control logic 260 extends over a third x-y region over which the bit lines 512 span. The first x-y region, the second x-y region, and the third x-y region are non-overlapping. Note that neither the first x-y region nor the second x-y region extends in the y-direction across the entire x-y region spanned by the bit lines, which allows the system control logic 260 to extend in the x-direction across the x-y plane of the bit lines 512. For example, FIG. 5A shows dashed line 513, which depicts how the system control circuitry 260 on the side of the column control circuitry 210 extends across the entire unit 500(1) in the x-direction. The floorplan allows routing through the region of the system control logic 260 without the need to cross a region having column control circuitry 210, which simplifies routing. Therefore, cost is reduced. Moreover, the overall size of the control circuitry may be reduced.

As noted above, the first column control circuitry 210(1) is connected to and used to operate the first set of BLs 512a. The second column control circuitry 210(2) is connected to and used to operate the second set of BLs 512b. The column control circuitry 210 may have bit line drivers 214 (see FIG. 2B) for providing voltages to the bit lines 512. The column control circuitry 210 may have sense amplifiers (or R/W circuits 225 (see FIG. 2B)) for sensing the bit lines 512. FIG. 5B depicts a first set of BL contacts 520. Each BL contact 520 in first set connects to one BL in the first set of BLs 512a. FIG. 5B depicts a second set of BL contacts 524. Each BL contact in second set 524 connects to one BL in the second set of BLs 512b. FIG. 5B depicts a set of BL bridge contacts 522. Each BL bridge contact is connected by a BL bridge 526 to a bit line 512b in the second set of BLs. The structures that connect the first column control circuitry 210(1) to the first set of BL contacts 520 are not depicted in FIG. 5B, but will be described below. Note that each bit line bridge 526 has a first segment that is above the second control circuitry 210(2) and a second segment that is above the system control circuitry 260. The structures that connect the second column control circuitry 210(2) to the BL bridge contacts 522 are not depicted in FIG. 5B, but will be described below.

Figure 5C:
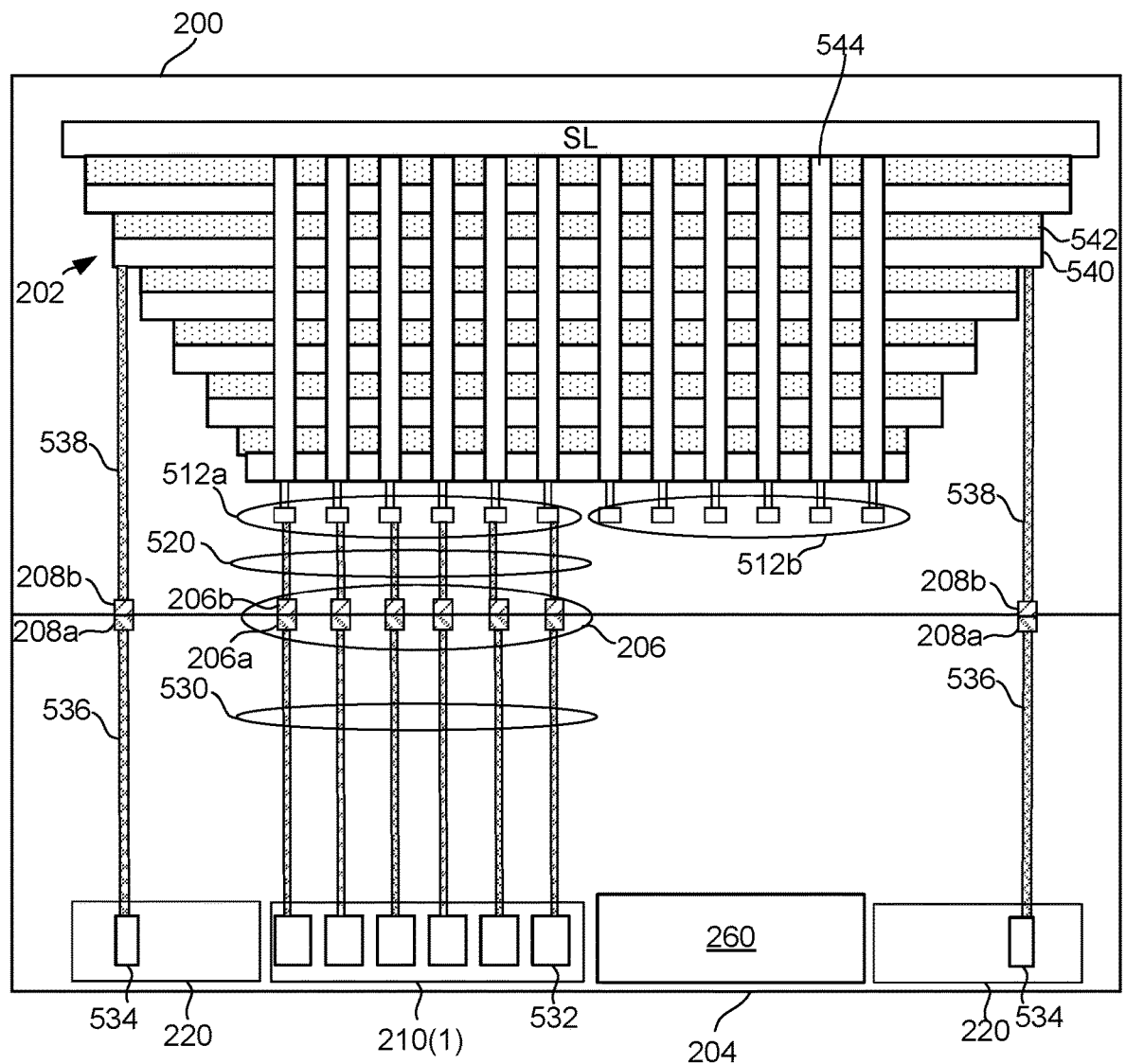
FIG. 5C depicts a cross-sectional view along line BB in FIG. 5B.

FIG. 5C depicts a cross-sectional view along line BB in FIG. 5B. FIG. 5C shows a control die 204 bonded to a memory die 200. The memory structure 202 has a stack of conductive layers 540 alternating with dielectric layers 542. NAND strings 544 are formed in the stack. The NAND strings 544 extend in the z-direction. Bit lines 512 reside in a metal layer adjacent to the stack. The control die 204 has row control circuitry 220, column control circuitry 210(1) and system control logic 260. The column control circuitry 210(1) has column circuits 532. Each column circuit 532 may include a sense amplifier and/or bit line driver. In some embodiments, the sense amplifier contains the bit line driver. Each particular column circuit 532 is electrically connected to a bit line in the first set of bit lines 512a. Each pathway includes a control die via structure 530 that connects the particular column circuit 532 to a control die bond pad 206a. A bit line contact/via 520 connects the memory die bond pad 206b to the bit line 512a. The second column control circuitry 210(2) are not depicted in FIG. 5C. Hence, no connections are depicted from second column control circuitry 210(2) to the second bit lines 512b in FIG. 5C. Those connections will be discussed below.

FIG. 5C also depicts example connections between word line drivers 534 and the memory structure 202. The memory structure 202 has a staircase structure at two edges to allow connections to be made to conductive layers 540. The conductive layers 540 may include word lines and select lines. A word line driver 534 in the row control circuitry 220 is connected to a die bond pad 208a by way of a via structure 536. Staircase via structure 538 connects memory die bond pad 208b to a conductive layer 540. The connections from other word line drivers 534 to the other conductive layers 540 are not depicted in FIG. 5C.

Figure 5D:
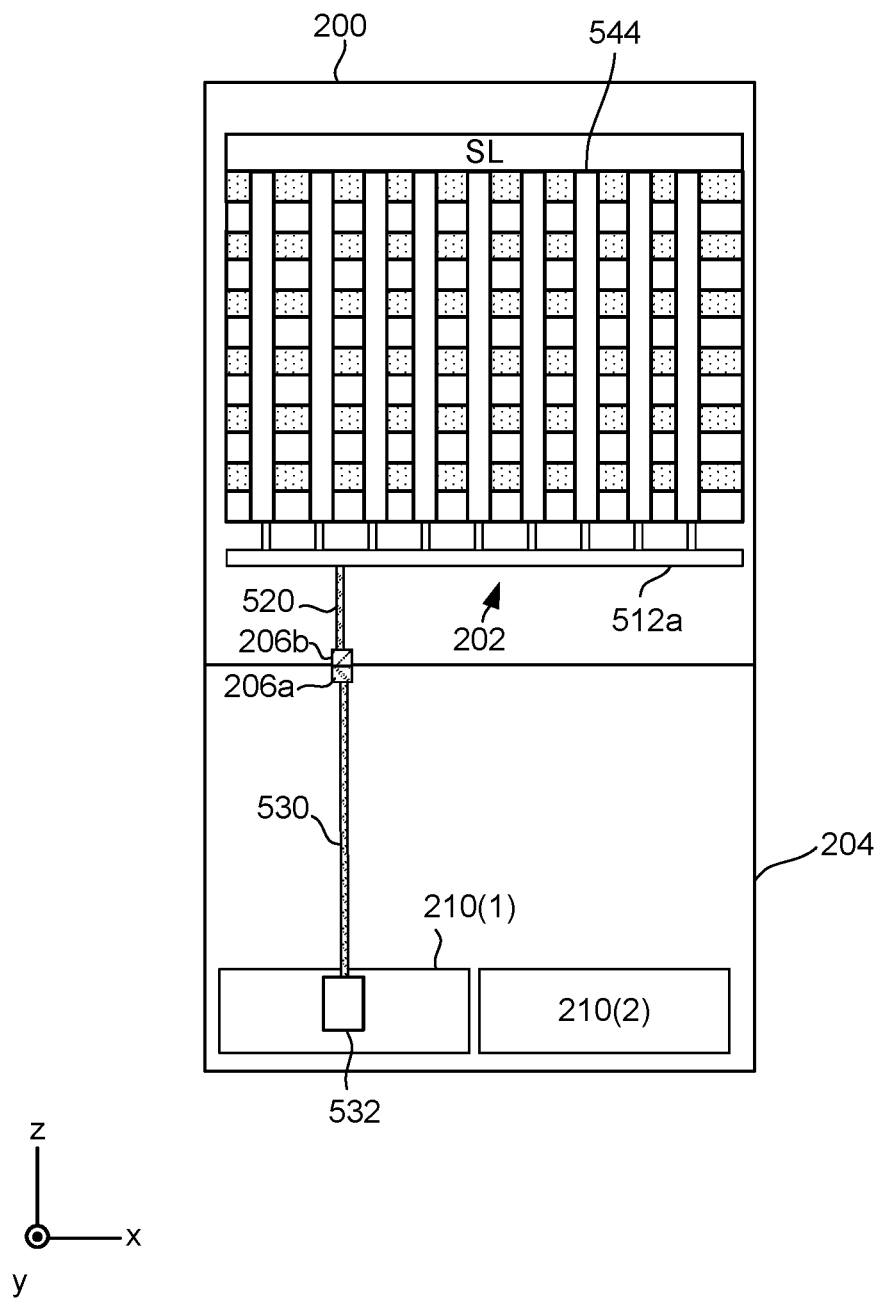
FIG. 5D depicts a cross-sectional view along line CC in FIG. 5B.

FIG. 5D depicts a cross-sectional view along line CC in FIG. 5B. The electrical connection between one of the column circuits 532 to one bit line 512a is depicted. The bit line 512a has a number of connections to the memory structure 202. These connections are in different sub-blocks (see FIG. 4B). Only a few of the many connections between the bit line 512a and memory structure are depicted in FIG. 5D. The second column control circuitry 210(2) is depicted in FIG. 5D. However the connections from second column control circuitry 210(2) to the second bit lines 512b are not depicted in FIG. 5D. Those connections will be discussed below.

Figure 5E:
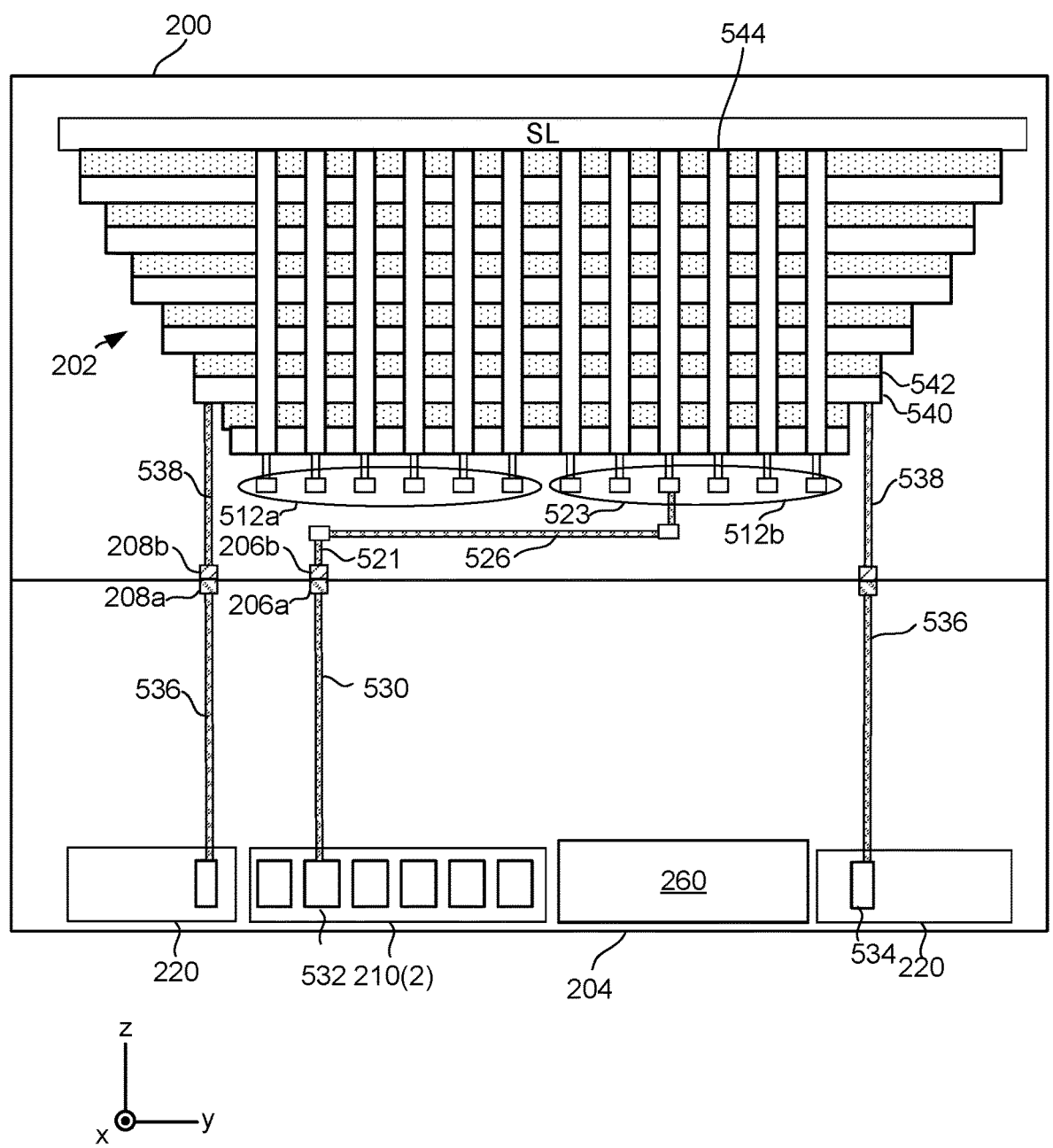
FIG. 5E depicts a cross-sectional view along line DD in FIG. 5B.

FIG. 5E depicts a cross-sectional view along line DD in FIG. 5B. FIG. 5E depicts a similar perspective as FIG. 5C, but is taken along a different cross-section to focus on a connection from second column control circuitry 210(2) to a bit line 512b. The control die 204 depicts row control circuitry 220, column control circuitry 210(2) and system control logic 260. The first column control circuitry 210(1) are not depicted in FIG. 5C. The second column control circuitry 210(2) has column circuits 532. Each particular column circuit 532 in the second column control circuitry 210(2) is electrically connected to a bit line in the second set of bit lines 512b. Each pathway includes a control die via structure 530 that connects the particular column circuit 532 to a control die bond pad 206a. A bit line contact/via 521 connects the memory die bond pad 206b to a bit line bridge 526 in a metal layer adjacent to the bit lines 512. The bit line bridge 526 extends in the y-direction and has a first end connected to the bit line contact/via 521 and a second end connected to a bit line contact 523 that connects to a bit line 512b. The bit line bridge 526 has a first segment that is above the second control circuitry 210(2) and a second segment that is above the system control circuitry 260. FIG. 5E also depicts some example connections between word line drivers 534 and the memory structure 202. The connections from other word line drivers 534 to the other conductive layers 540 are not depicted in FIG. 5E.

The connections from other circuits 532 in the second column control circuitry 210(2) to/from the second bit lines 512b may be similar in that other BL bridges 526 may be used in the metal layer adjacent to the bit lines 512. Note that with respect to FIG. 5E the region in the control die 204 above the system control logic 260 is not occupied by routing from column control circuitry 210 to/from the second bit lines 512b. Also, with respect to FIG. 5C that the region in the control die 204 above the system control logic 260 is not occupied by routing from column control circuitry 210 to/from the first bit lines 512a. Therefore, space above the system control logic 260 is freed up for other routing. For example, with reference again to FIG. 5A, arrow 552 shows possible routing on the control die 204 between the I/O 508 and system control logic 260 in unit 500(1) without crossing above any column control circuitry 210. Arrow 554 shows possible routing on the control die 204 between system control logic 260 in unit 500(1) and system control logic 260 in unit 500(2) without crossing above any column control circuitry 210. Arrow 556 shows possible routing on the control die 204 between the I/O 508 and system control logic 260 in unit 500(3) without crossing above any column control circuitry 210. Arrow 558 shows possible routing on the control die 204 between system control logic 260 in unit 500(3) and system control logic 260 in unit 500(4) without crossing above any column control circuitry 210. Therefore routing is simplified. Moreover cost is saved. Furthermore, size of the control die 204 may be reduced.

Figure 5F:
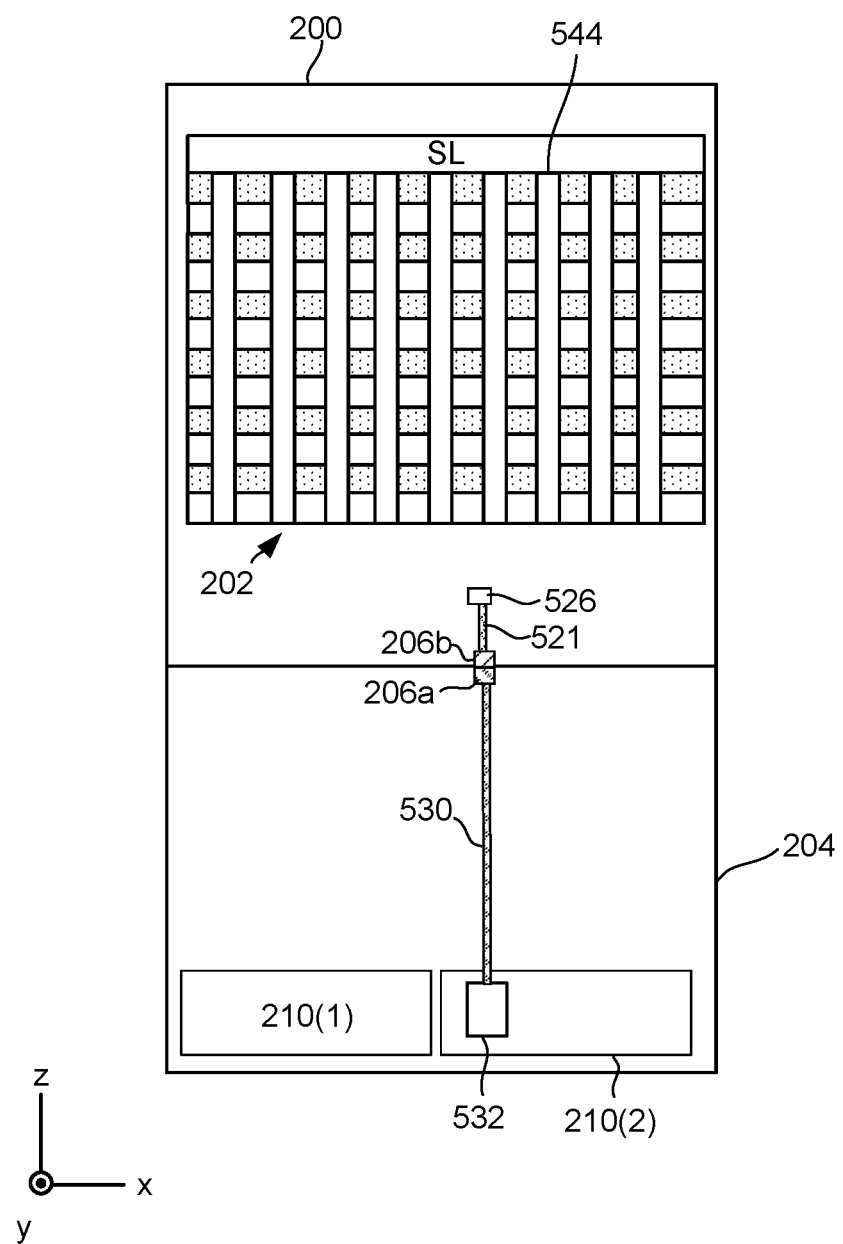
FIG. 5F depicts a cross-sectional view along line EE in FIG. 5B.

FIG. 5F depicts a cross-sectional view along line EE in FIG. 5B. The electrical connection between one of the column circuits 532 in second column control circuitry 210(2) to a bit line bridge 526 is depicted. The bit line 512b to which the bit line bridge 526 connects is not depicted in FIG. 5F due to the location of line EE. The first column control circuitry 210(1) are depicted in FIG. 5F. However, the connections from first column control circuitry 210(1) to the first bit lines 512a are not depicted in FIG. 5F. Those connections have been already discussed.

Figure 6A:
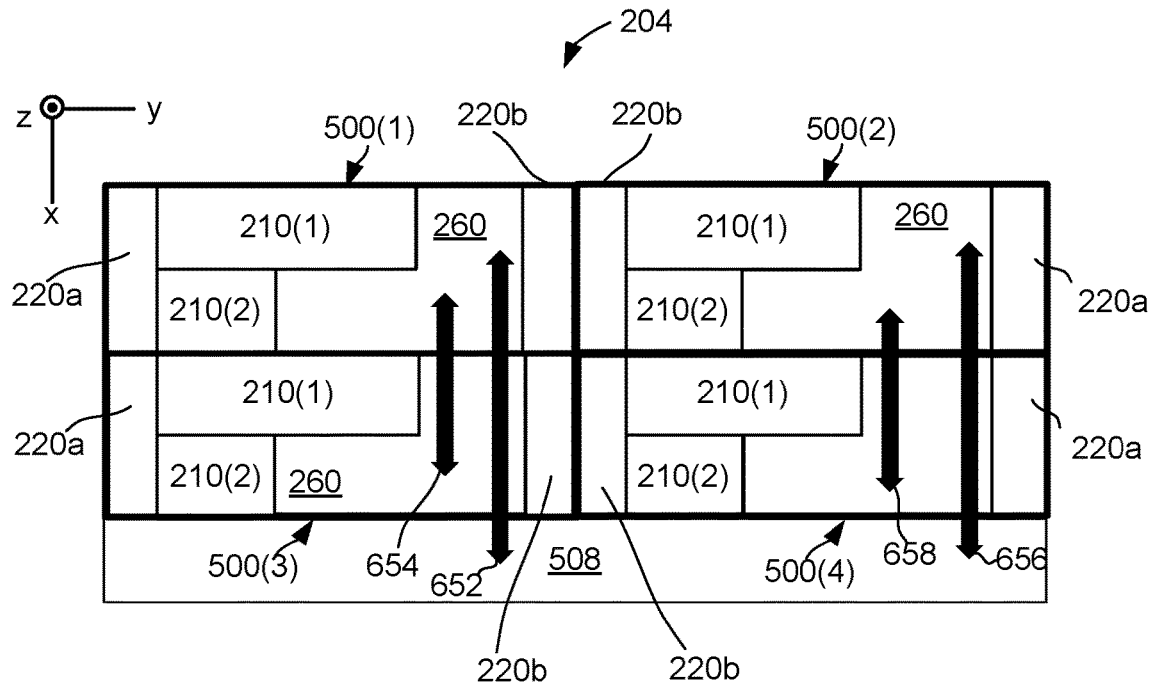
FIG. 6A depicts the floorplan of one embodiment of control circuitry in a control die in which upper and lower column control circuitry occupy significantly different area of the floorplan.

FIG. 6A depicts the floorplan of one embodiment of control circuitry in a control die 204. The floorplan is divided into four units 500(1), 500(2), 500(3) and 500(4) similar to the floorplan in FIG. 5A. A portion of the first column control circuitry 210(1) is stacked with the second column control circuitry 210(2). However, the configuration of the first column control circuitry 210(1) and second column control circuitry 210(2) differs in FIG. 6A relative to FIG. 5A. In the configuration of FIG. 5A, the first column control circuitry 210(1) and second column control circuitry 210(2) occupy substantially the same area in the x-y plane. Herein, the phrase, "substantially the same area in the x-y plane" means that the difference in area is 5% or less. In the configuration of FIG. 6A, the first column control circuitry 210(1) occupies substantially more area than the second column control circuitry 210(2). Herein, the phrase, "substantially more area in the x-y plane" means that the difference in area is 10% or more.

Figure 6B:
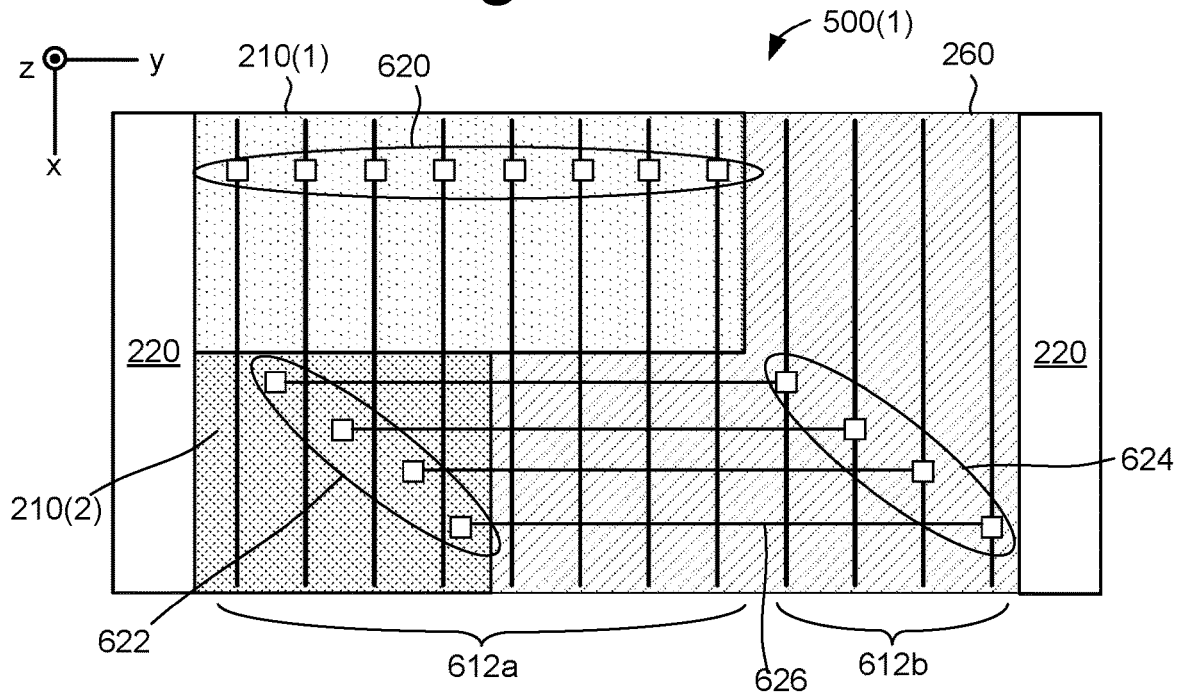
FIG. 6B depicts further details of one embodiment of unit 500(1) from FIG. 6A.

FIG. 6B depicts further details of one embodiment of unit 500(1) from FIG. 6A. Bit lines 512 are also depicted to show the relative locations of the bit lines in the x-y dimension. There are a first set of BLs 612a and a second set of BLs 612b. A total of 12 bit lines are depicted in FIG. 6B. The bit lines extend in the x-direction. There will be many more bit lines. The bit lines 612 in FIG. 6B are representative of the bit lines of one plane 400 in the memory die 200. The bit lines 612 span an x-y plane that is parallel to the x-y plane of the floorplan. The first column control circuitry 210(1) is connected to and used to operate the first set of BLs 612a. The second column control circuitry 210(1) is connected to and used to operate the second set of BLs 612b. Note that there are more bit lines in the first set of BLs 612a than in the second set of BLs 612b. In one embodiment, there are substantially more bit lines in one set of bit lines than the other. Herein, "substantially more bit lines in one set of bit lines than the other set of bit lines" means that there are at least 5% more bit lines in one set than in the other set. In one embodiment, there are approximately the same number of bit lines in each set of bit lines. Herein, "approximately the same number of bit lines in each set of bit lines" means that the difference is less than 2%.

FIG. 6B depicts a first set of BL contacts 620. Each BL contact 620 in first set connects to one BL in the first set of BLs 612a. FIG. 6B depicts a second set of BL contacts 624. Each BL contact in second set 624 connects to one BL in the second set of BLs 612b. FIG. 6B depicts a set of BL bridge contacts 622. Each BL bridge contact/second BL contact is connected by a BL bridge 626. Each bit line bridge 626 has a first segment above the second column control circuitry 210(2) and a second segment above the system control circuitry 260. The structures that connect the first column control circuitry 210(1) to the first set of BL contacts 620 are not depicted in FIG. 6B, but in one embodiment are similar to structures 520, 530 depicted in FIG. 5C. The structures that connect the second column control circuitry 210(2) to the BL bridge contacts 622 are not depicted in FIG. 6B, but in one embodiment are similar to structures 521, 530 depicted in FIG. 5C.

Note that the column control circuitry 210 in FIGS. 6A and 6B does not extend in the y-direction across the entire set of bit lines 612. Instead the column control circuitry 210 is divided into first column control circuitry 210(1) that is stacked in the x-direction with second column control circuitry 210(2). Therefore, the first column control circuitry 210(1) extends over a first x-extent that does not overlap with a second x-extent over which the second column control circuitry 210(1) extends. The first column control circuitry 210(1) extends over a first x-y region that is a subset of the x-y region over which the bit lines 612 span. The second column control circuitry 210(2) extends over a second x-y region that is a different subset of the x-y region over which the bit lines 612 span. The system control logic 260 extends over a third x-y region over which the bit lines 612 span. The first x-y region, the second x-y region, and the third x-y region are non-overlapping. Note that neither the first x-y region nor the second x-y region extends in the y-direction across the entire x-y region spanned by the bit lines, which allows the system control logic 260 to extend in the x-direction across the x-y region of the bit lines 612. The floorplan allows routing through the region of the system control logic 260 without the need to cross a region having column control circuitry 210, which simplifies routing. For example, with reference again to FIG. 6A, arrow 652 shows possible routing on the control die 204 between the I/O 508 and system control logic 260 in unit 500(1) without crossing any region having column control circuitry 210. Arrow 654 shows possible routing on the control die 204 between system control logic 260 in unit 500(1) and system control logic 260 in unit 500(2) without crossing any region having column control circuitry 210. Arrow 656 shows possible routing on the control die 204 between the I/O 508 and system control logic 260 in unit 500(3) without crossing any region having column control circuitry 210. Arrow 658 shows possible routing on the control die 204 between system control logic 260 in unit 500(3) and system control logic 260 in unit 500(4) without crossing any region having column control circuitry 210. Therefore routing is simplified. Moreover cost is saved. Furthermore, size of the control die 204 may be reduced.

Figure 7A:
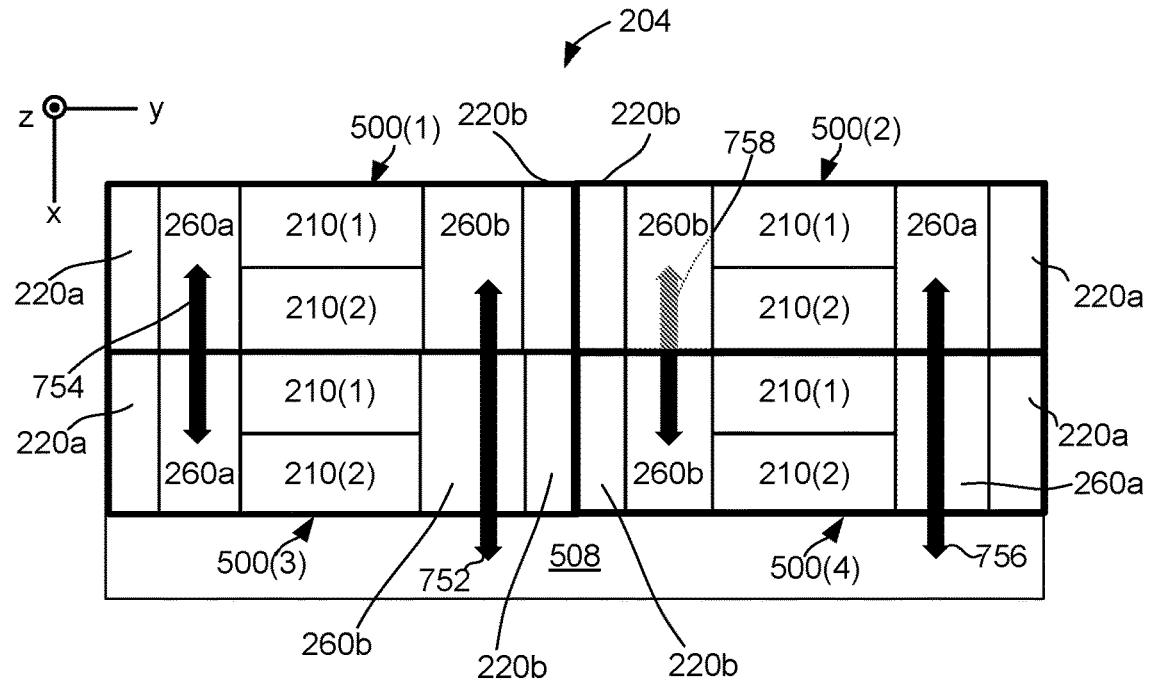
FIG. 7A depicts the floorplan of one embodiment of control circuitry in a control die in which system control logic is divided to two sides the column control circuitry in the y-direction.
Figure 7B:
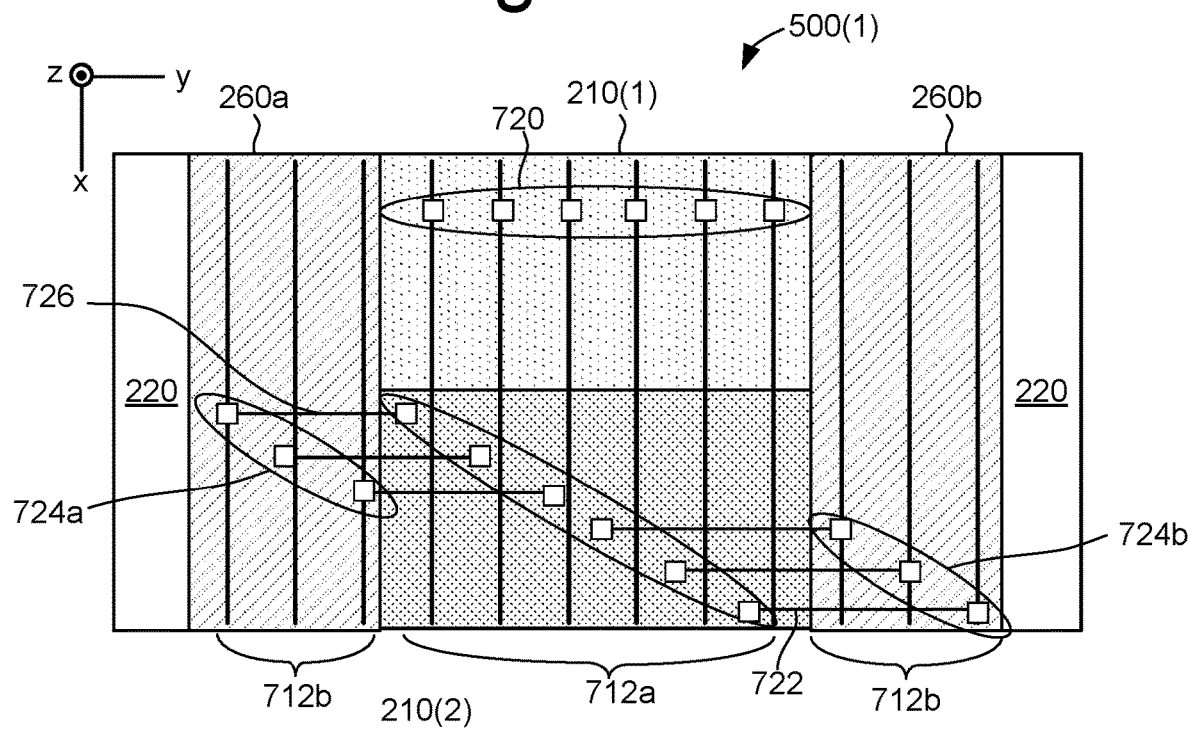
FIG. 7B depicts further details of one embodiment of unit 500(1) from FIG. 7A.

FIG. 7A depicts the floorplan of one embodiment of control circuitry in a control die 204. The floorplan is divided into four units 500(1), 500(2), 500(3) and 500(4) similar to the floorplan in FIGS. 5A and 5B. The first column control circuitry 210(1) is stacked with the second column control circuitry 210(2). However, the configuration of the first column control circuitry 210(1) and second column control circuitry 210(2) differs in FIG. 7A relative to FIG. 5A or 6A. In the configuration of FIGS. 7A and 7B, the first column control circuitry 210(1) and second column control circuitry 210(2) occupy a middle portion in the y-direction, with the system control circuitry divided into outer system control circuitry 260a and inner system control circuitry 260b.

FIG. 7B depicts further details of one embodiment of unit 500(1) from FIG. 7A. Bit lines 512 are also depicted to show the relative locations of the bit lines in the x-y dimension. There are a first set of BLs 712a and a second set of BLs 712b. The first column control circuitry 210(1) is connected to and used to operate the first set of BLs 712a. The second column control circuitry 210(1) is connected to and used to operate the second set of BLs 712b.

FIG. 7B depicts a first set of BL contacts 720. Each BL contact 720 in the first set connects to one BL in the first set of BLs 712a. The structures that connect the first column control circuitry 210(1) to first set of BL contacts 720 are not depicted in FIG. 7B, but in one embodiment are similar to structures 520, 530 depicted in FIG. 5C. FIG. 7B depicts second sets of BL contacts 724a, 724b. Each BL contact in second set 724 connects to one BL in the second set of BLs 712b. FIG. 7B depicts a set of BL bridge contacts 722. Each BL bridge contact/second BL contact is connected by a BL bridge 726. Each bit line bridge 726 has a first segment above the second column control circuitry 210(2) and a second segment above the system control circuitry 260. The structures that connect the second column control circuitry 210(2) to the BL bridge contacts 722 are not depicted in FIG. 7B, but in one embodiment are similar to structures 521, 530 depicted in FIG. 5C.

The floorplan of FIGS. 7A-7B allows routing through the region of the system control logic 260 without the need to cross a region having column control circuitry 210, which simplifies routing. For example, with reference again to FIG. 7A, arrow 752 shows possible routing on the control die 204 between the I/O 508 and system control logic 260b in unit 500(1) without crossing any region having column control circuitry 210. Arrow 754 shows possible routing on the control die 204 between system control logic 260a in unit 500(1) and system control logic 260 in unit 500(2) without crossing any region having column control circuitry 210. Note that the routing implied by arrow 752 also applied to the outer system control logic 260a and the routing implied by arrow 754 also applied to the inner system control logic 260b. Arrow 756 shows possible routing on the control die 204 between the I/O 508 and system control logic 260a in unit 500(3) without crossing any region having column control circuitry 210. Arrow 758 shows possible routing on the control die 204 between system control logic 260a in unit 500(3) and system control logic 260a in unit 500(4) without crossing any region having column control circuitry 210. Note that the routing implied by arrow 756 also applies to the inner system control logic 260b and the routing implied by arrow 758 also applies to the outer system control logic 260a. Therefore routing is simplified. Moreover cost is saved. Furthermore, size of the control die 204 may be reduced.

Figure 8A:
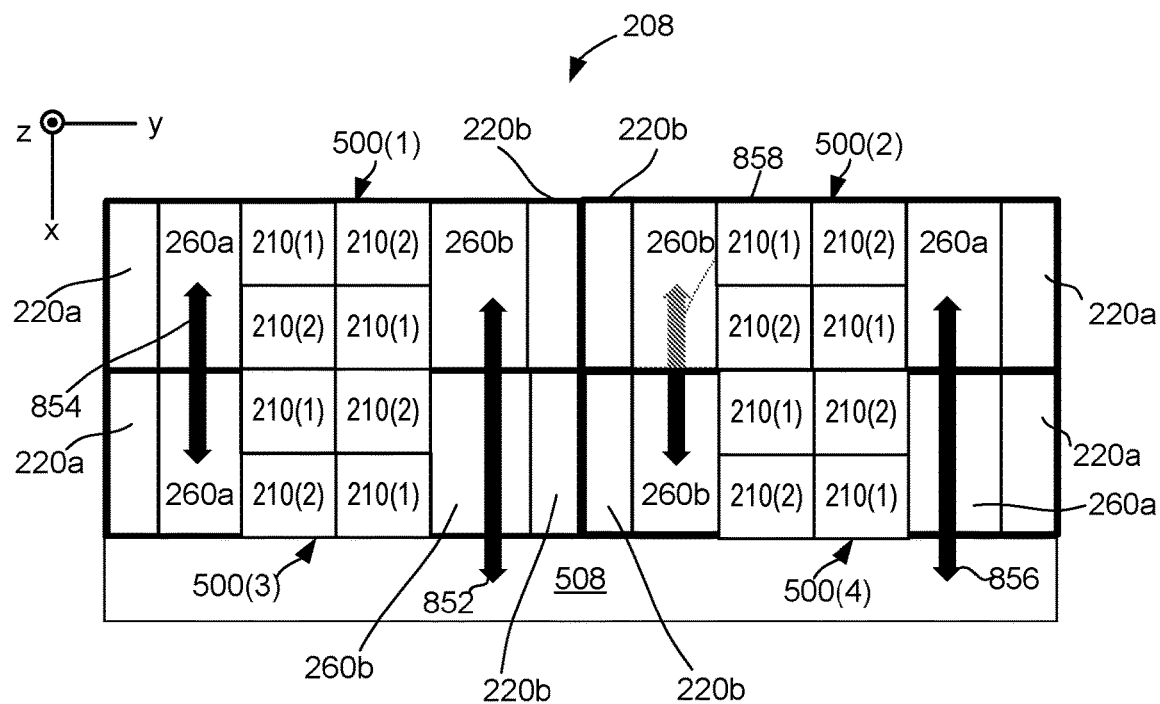
FIGS. 8A and 8B depict an alternative arrangement of the floorplan in which the column control circuitry is located in the same region as that in FIG. 7A, but having a different assignment between the column control circuitry to the bit lines.
Figure 8B:
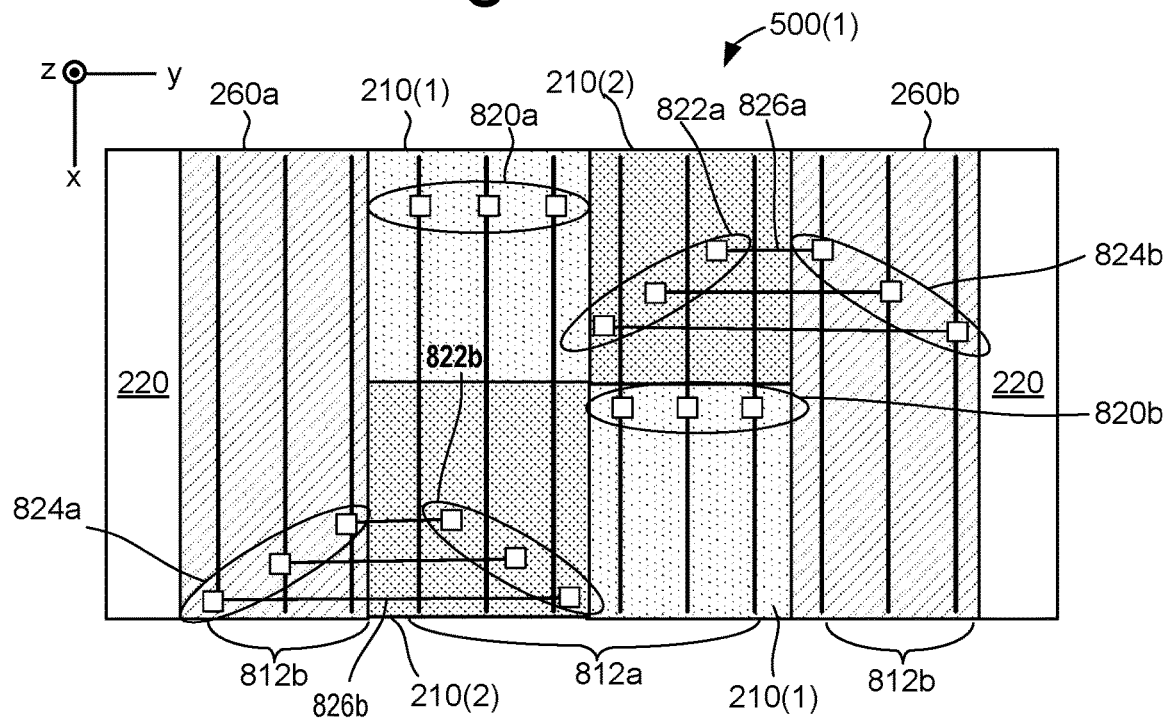

FIGS. 8A-8B depict an alternative arrangement of the floorplan in which the column control circuitry 210 is located in the same region as that in FIG. 7A, but the assignment between the column control circuitry 210 to the bit lines is different. The first column control circuitry 210(1) is stacked with the second column control circuitry 210(2). One portion of the column control circuitry 210 is used to control bit lines for which the bridge lines are used (e.g., those BLs 812b above the system control circuitry 260) and another portion of the column control circuitry 210 is used to control bit lines for which the bridge lines are not needed used (e.g., those BLs 812a above the column control circuitry 210). For the purpose of discussion, the column control circuitry 210 that is used to control BLs 812a for which bridge lines are not needed will be referred to as the first column control circuitry 210(1) and the column control circuitry 210 that is used to control BLs 812b for which bridge lines are used will be referred to as the second column control circuitry 210(2).

FIG. 8B depicts further details of one embodiment of unit 500(1) from FIG. 8A. Bit lines 512 are also depicted to show the relative locations of the bit lines in the x-y dimension. There are a first set of BLs 812a and a second set of BLs 812b. The first column control circuitry 210(1) is connected to and used to operate the first set of BLs 812a. The second column control circuitry 210(2) is connected to and used to operate the second set of BLs 812b.

FIG. 8B depicts first sets of BL contacts 820a, 820b. Each BL contact in the first sets of BL contacts 820a, 820b connects to one BL in the first set of BLs 812a. The structures that connect the first column control circuitry 210(1) to first set of BL contacts 820a, 820b are not depicted in FIG. 8B, but in one embodiment are similar to structures 520, 530 depicted in FIG. 5C. FIG. 8B depicts second sets of BL contacts 824a, 824b. Each BL contact in second sets 824 connects to one BL in the second set of BLs 812b. FIG. 8B depicts set of BL bridge contacts 822a, 822b. Each BL bridge contact/second BL contact is connected to a BL bridge 826a, 826b. Each bit line bridge 826 has a first segment above the second column control circuitry 210(2) and a second segment above the system control circuitry 260. The structures that connect the second column control circuitry 210(2) to the BL bridge contacts 822 are not depicted in FIG. 8B, but in one embodiment are similar to structures 521, 530 depicted in FIG. 5C.

The floorplan of FIGS. 8A-8B allows routing through the region of the system control logic 260 without the need to cross a region having column control circuitry 210, which simplifies routing. For example, with reference again to FIG. 8A, arrow 852 shows possible routing on the control die 204 between the I/O 508 and system control logic 260b in unit 500(1) without crossing any region having column control circuitry 210. Arrow 854 shows possible routing on the control die 204 between system control logic 260a in unit 500(1) and system control logic 260a in unit 500(2) without crossing any region having column control circuitry 210. Note that the routing implied by arrow 852 also applied to the outer system control logic 260a and the routing implied by arrow 854 also applied to the inner system control logic 260b. Arrow 856 shows possible routing on the control die 204 between the I/O 508 and system control logic 260a in unit 500(3) without crossing any region having column control circuitry 210. Arrow 858 shows possible routing on the control die 204 between system control logic 260a in unit 500(3) and system control logic 260a in unit 500(4) without crossing any region having column control circuitry 210. Note that the routing implied by arrow 856 also applies to the inner system control logic 260b and the routing implied by arrow 858 also applies to the outer system control logic 260a. Therefore routing is simplified. Moreover cost is saved. Furthermore, size of the control die 204 may be reduced.

In one embodiment that is an alternative to an embodiment depicted in FIGS. 8A-8B, the upper half of the column control circuitry 210 is used to control the leftmost bit lines and the lower half of the column control circuitry 210 is used to control the rightmost bit lines. In one such variation, rather than the bit line bridges 826a in the upper (in x-direction) being used to connect to the bit lines on the right, the bit line bridges 826a in the upper (in x-direction) are used to connect to the bit lines on the left. Also, rather than the bit line bridges 826b in the bottom (in x-direction) being used to connect to the bit lines on the left, the bit line bridges 826b in the lower (in x-direction) are used to connect to the bit lines on the right.

Figure 9A:
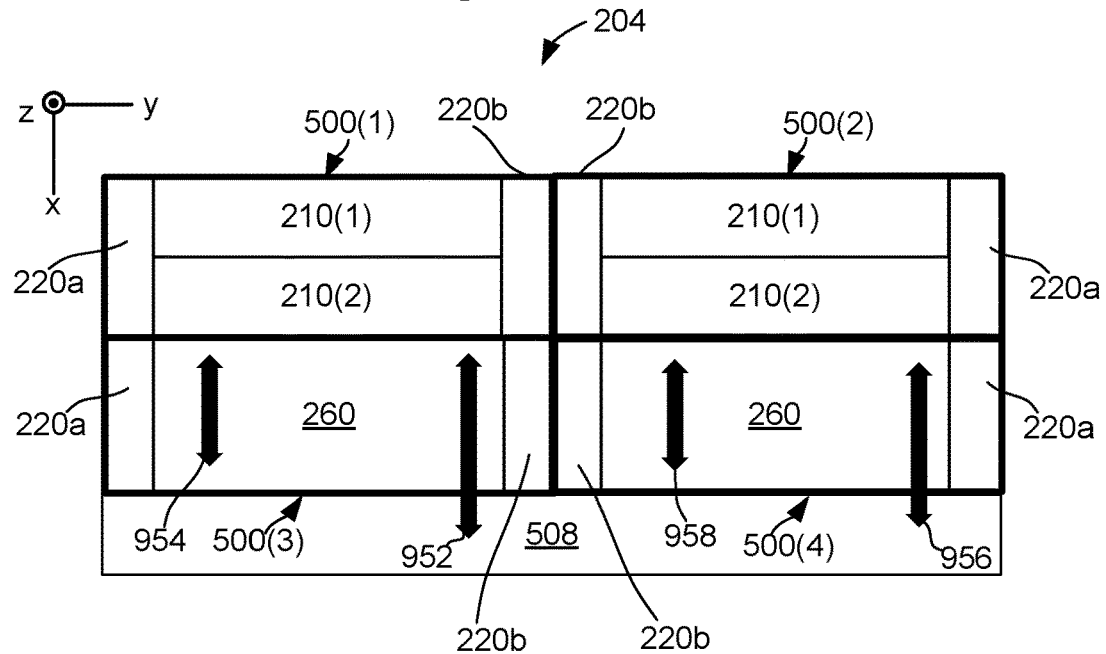
FIG. 9A depicts control circuitry in a control die having a floorplan in which first column control circuitry is used to operate bit lines in a first plane on the memory die and second column control circuitry is used to operate bit lines in a second plane on the memory die.

In some embodiments, the first column control circuitry 210(1) and the second column control circuitry 210(2) are used to operate two different sets of bit lines in the same plane in the memory die 200. In some embodiments, the first column control circuitry 210(1) is used to operate bit lines in a first plane on the memory die 200 and the second column control circuitry 210(1) is used to operate bit lines in a second plane on the memory die 200. FIG. 9A depicts control circuitry in a control die 204 having a floorplan in which the first column control circuitry 210(1) is used to operate bit lines in a first plane on the memory die 200 and the second column control circuitry 210(1) is used to operate bit lines in a second plane on the memory die 200.

Figure 9B:
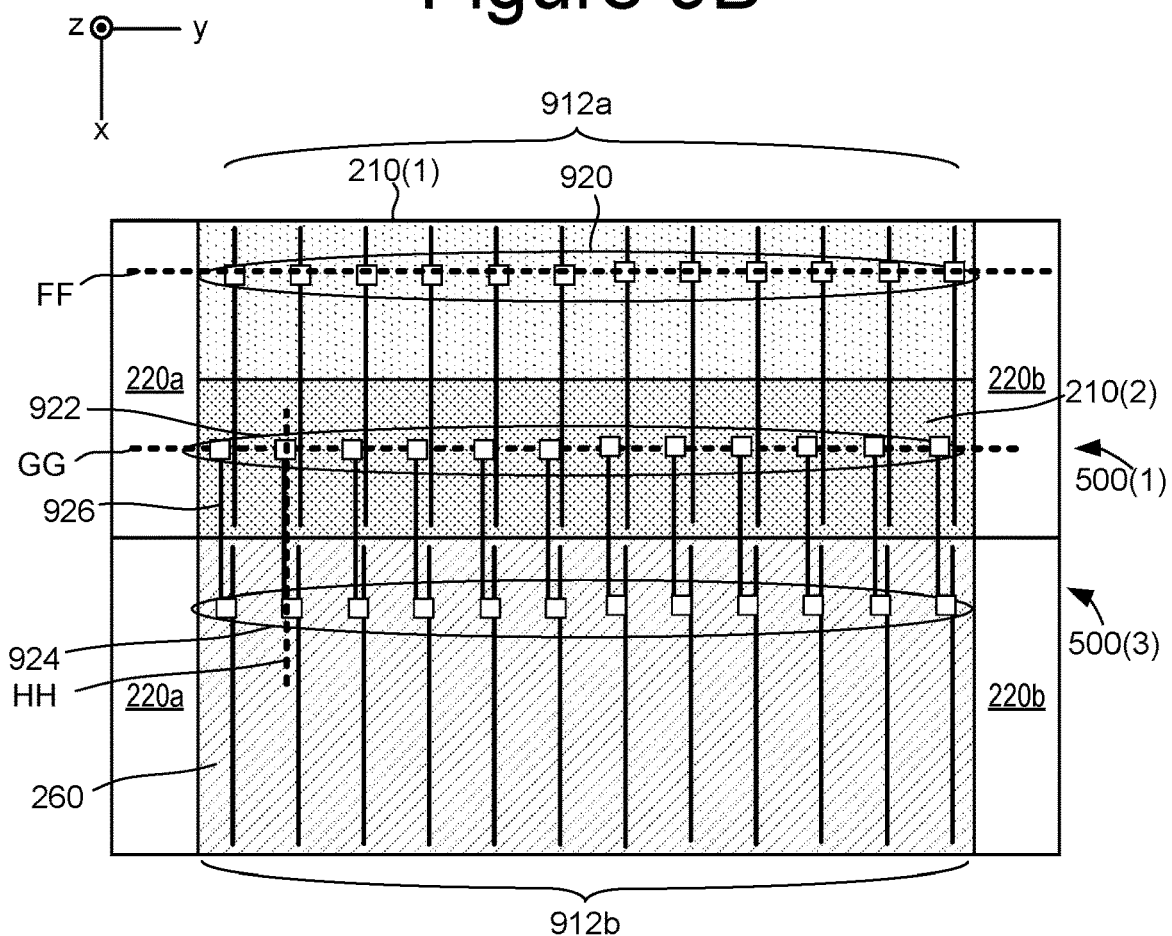
FIG. 9B depicts an embodiment of the control circuitry for units 500(1) and 500(3) from FIG. 9A.

FIG. 9B depicts an embodiment of the control circuitry for units 500(1) and 500(3) from FIG. 9A. In general, unit 500(1) is located below a first set of bit lines 912a that may include all of the bit lines of a first plane in the memory die 200. Unit 500(3) is located below a second set of bit lines 912b that may include all of the bit lines of a second plane in the memory die 200. The first column control circuitry 210(1) is used to operate bit lines 912a The second column control circuitry 210(2) is used to operate bit lines 912b. In an embodiment, BL bridges 926 are used in the electrical pathways between the second column control circuitry 210(2) and the second set of bit lines 912b.

The first column control circuitry 210(1) is connected to and used to operate the first set of BLs 912a. The second column control circuitry 210(2) is connected to and used to operate the second set of BLs 512b. FIG. 9B depicts a first set of BL contacts 920. Each BL contact in first set of BL contacts 920 connects to one BL in the first set of BLs 912a. The structures that connect the first column control circuitry 210(1) to the first set of BL contacts 920 are not depicted in FIG. 9B, but will be described below. FIG. 9B depicts a second set of BL contacts 924. Each BL contact in second set 924 connects to one BL in the second set of BLs 912b. FIG. 9B depicts a set of BL bridge contacts 922. Each BL bridge contact 922 is connected by a BL bridge 926 to a BL 912b in the second set of BLs. Note that each BL bridge 926 has a first segment above the second column control circuitry 210(2) and a second segment above the system control circuitry 260. The structures that connect the second column control circuitry 210(2) to the BL bridge contacts 922 are not depicted in FIG. 9B, but will be described below.

Note that the column control circuitry 210 is divided into first column control circuitry 210(1) that is stacked in the x-direction in one of the units 500 with second column control circuitry 210(2). Therefore, the first column control circuitry 210(1) extends over a first x-extent that does not overlap with a second x-extent over which the second column control circuitry 210(1) extends. The first column control circuitry 210(1) extends over a first x-y region that is a subset of the x-y region over which the bit lines 912 span. The second column control circuitry 210(2) extends over a second x-y region that is a different subset of the x-y region over which the bit lines 912 span. The system control logic 260 extends over a third x-y region over which the bit lines 912 span. The first x-y region, the second x-y region, and the third x-y region are non-overlapping. Note that the floorplan allows routing through the region of the system control logic 260 without the need to cross a region having column control circuitry 210, which simplifies routing. Therefore, cost is reduced. Moreover, the overall size of the control circuitry may be reduced.

For example, with reference again to FIG. 9A, arrow 952 shows possible routing on the control die 204 between the I/O 508 and system control logic 260 in unit 500(3) without crossing any region having column control circuitry 210. Arrow 954 shows possible routing on the control die 204 between system control logic 260 in unit 500(3) without crossing any region having column control circuitry 210. Arrow 956 shows possible routing on the control die 204 between the I/O 508 and system control logic 260 in unit 500(4) without crossing any region having column control circuitry 210. Arrow 958 shows possible routing on the control die 204 between system control logic 260 within unit 500(4) without crossing any region having column control circuitry 210. Therefore routing is simplified. Moreover cost is saved. Furthermore, size of the control die 204 may be reduced.

Figure 9C:
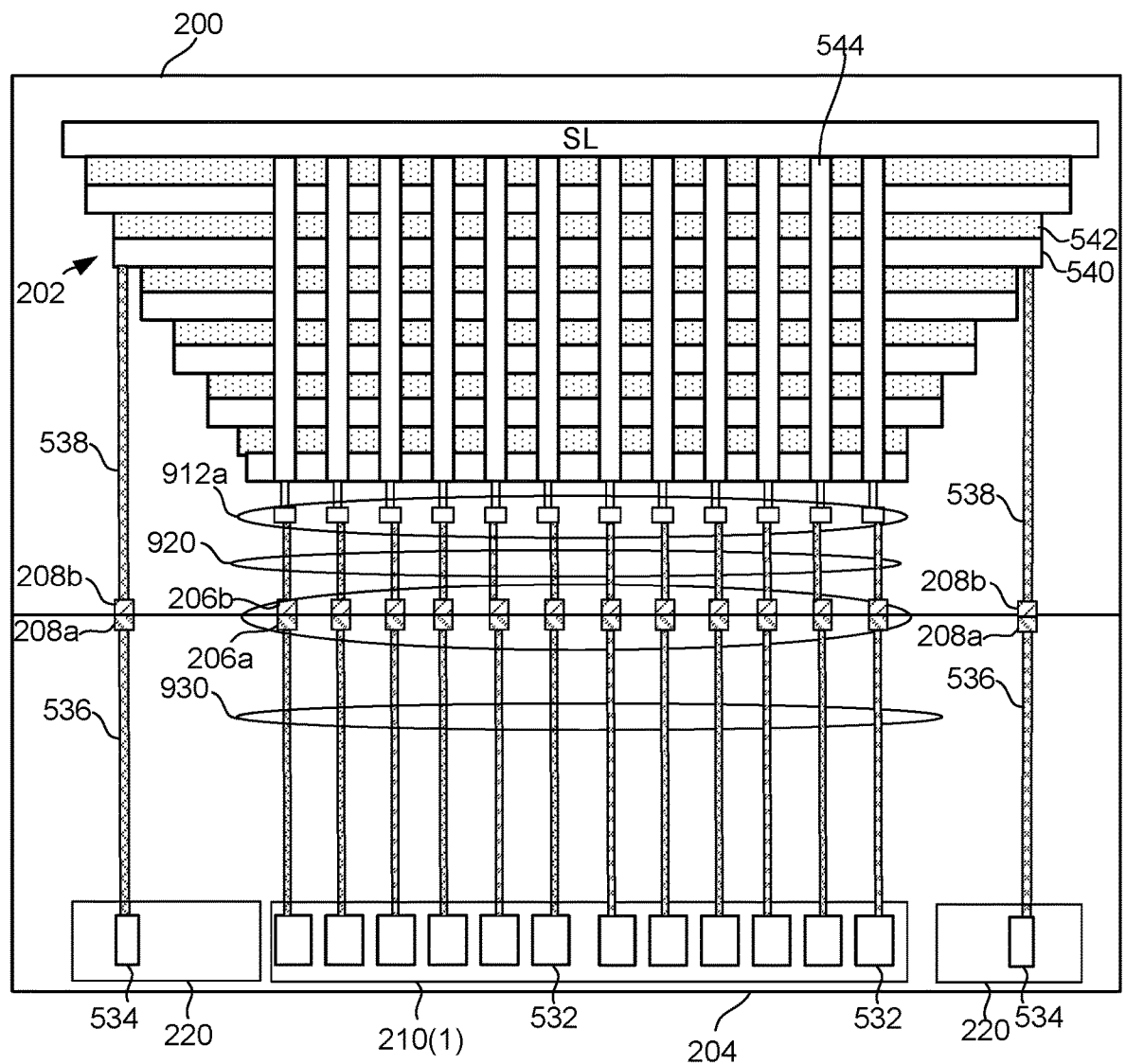
FIG. 9C depicts a cross-section along line FF of FIG. 9B.

Further details of the electrical connections between the column control circuitry 210 and the bit lines will now be discussed. FIG. 9B shows the first set of bit line contacts 920 that connect to the first set of bit lines 912. FIG. 9C depicts a cross-section along line FF of FIG. 9B. The first column control circuitry 210(1) may be connected to the first set of bit line contacts 920 in an analogous manner as the first column control circuitry 210(1) is connected to the first set of bit line contacts 520 in FIGS. 5C and 5D. For example, the electrical connection may include a control die via structure 930 that connects the particular column circuit 532 to a control die bond pad 206a. A bit line contact/via 920 may connect the memory die bond pad 206b to the bit line 912a.

Figure 9D:
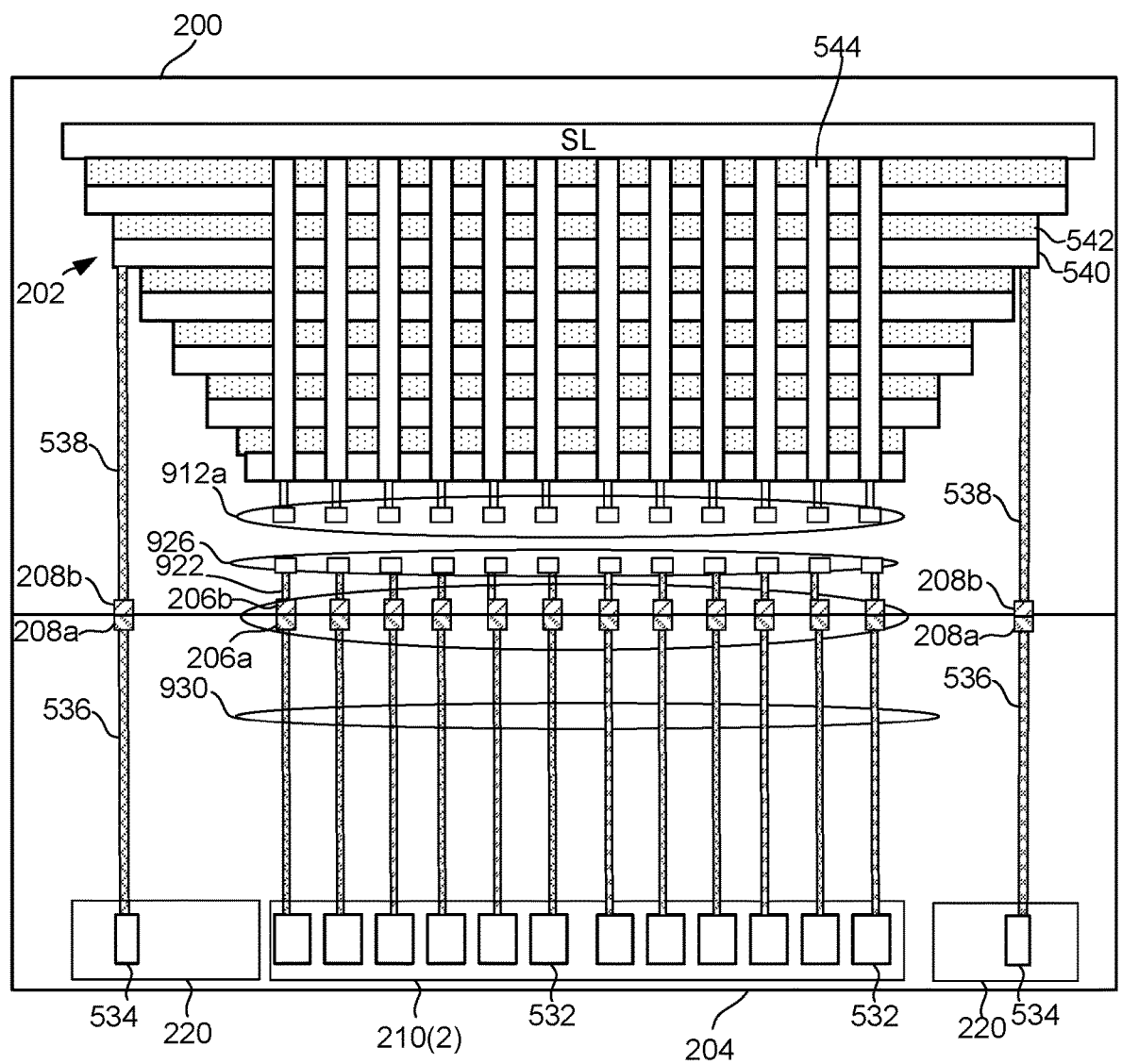
FIG. 9D depicts a cross-section along line GG of FIG. 9B.
Figure 9E:
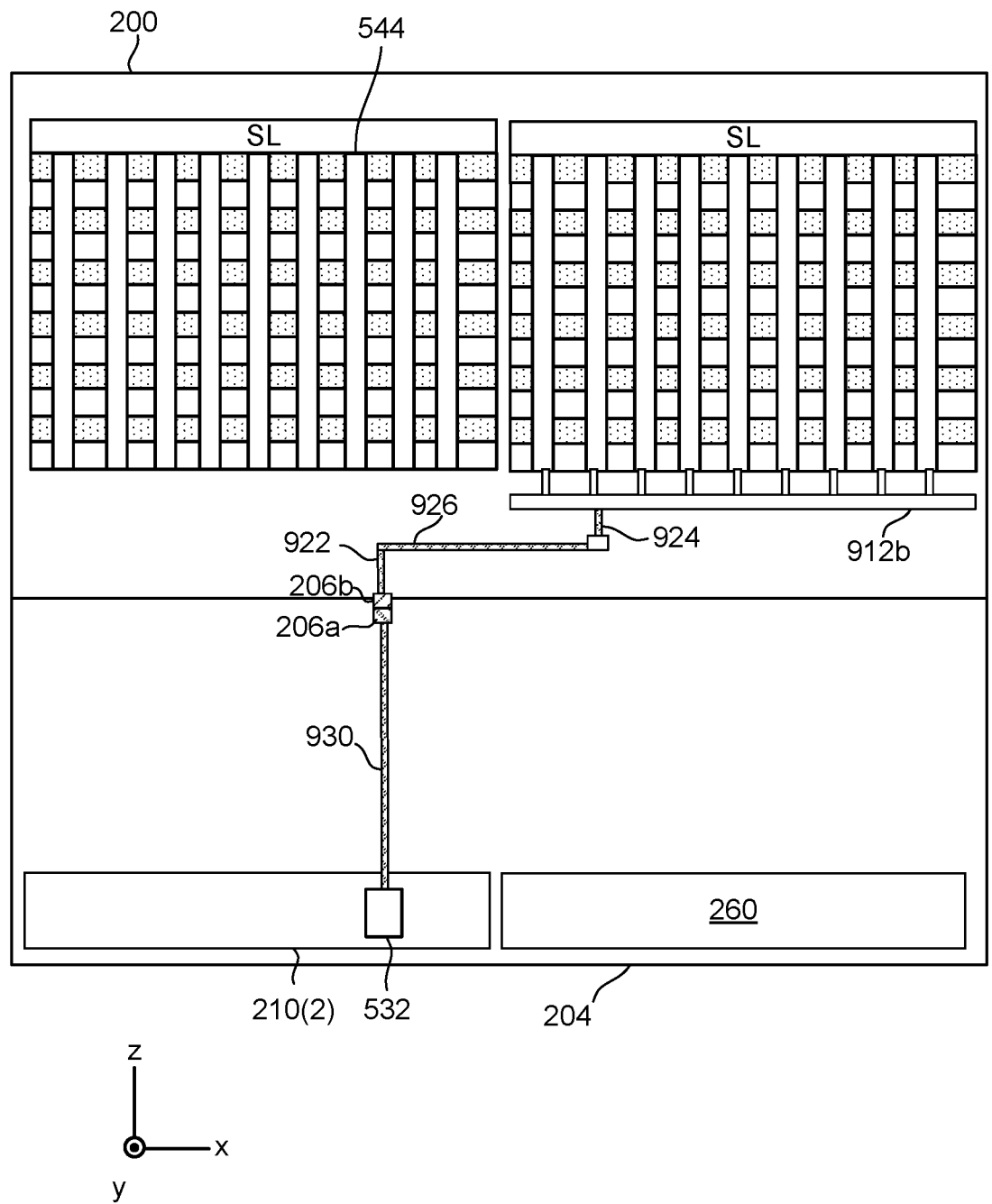
FIG. 9E depicts a cross-section along line HH of FIG. 9B.

FIG. 9B shows the bit line contact/vias 922 that connect to the BL bridges 926. FIG. 9D depicts a cross-section along line GG of FIG. 9B. FIG. 9E depicts a cross-section along line HH of FIG. 9B. Note that the memory structure 202 depicted FIG. 9D resides in the plane of the memory die that resides above the column control circuitry 210. Thus, the second column control circuitry 210(2) does not connect to the bit lines 912a depicted in FIG. 9D. The second column control circuitry 210(2) is connected to the respective BL bridge 926. For example, the electrical connections between the second column control circuitry 210(2) and the second bit lines 912b (not shown in FIG. 9D) may include a control die via structure 930 that connects the particular column circuit 532 to a control die bond pad 206a. A bridge contact/via 922 may connect the memory die bond pad 206b to the BL bridge 926. Each BL bridge 926 extends in the x-direction to contact one of the second bit lines 912b. FIG. 9E shows the that BL bridge 926 has a first segment above the second column control circuitry 210(2) and a second segment above the system control circuitry 260.

Figure 10:
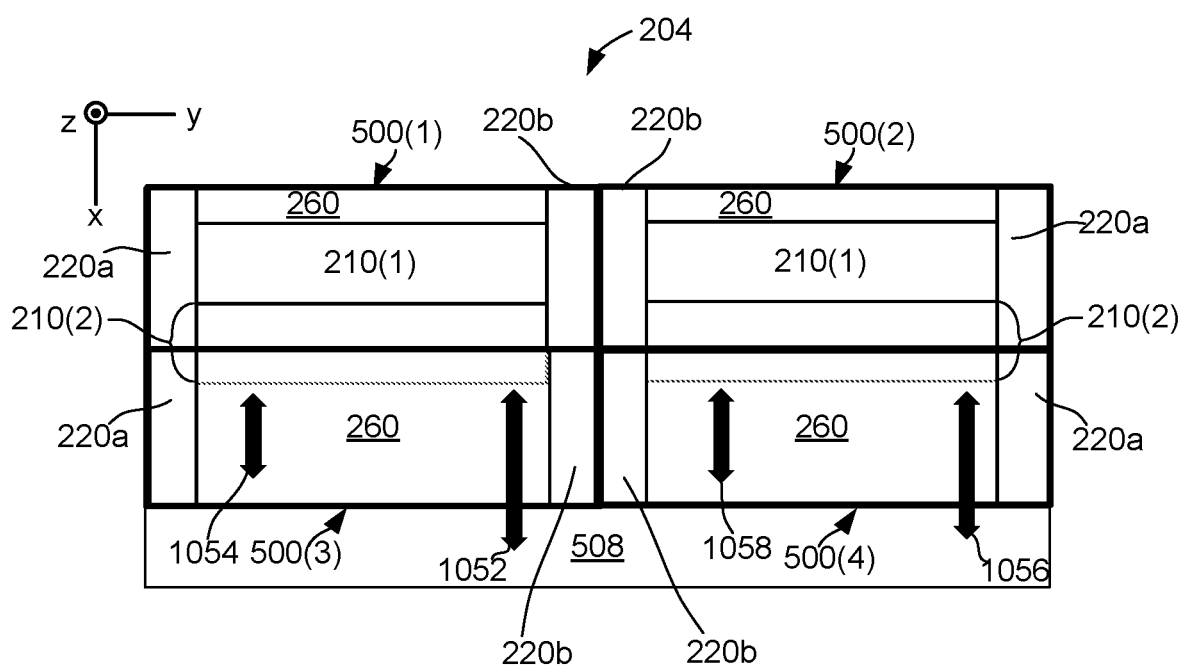
FIG. 10 depicts a variation of the floorplan of FIG. 9A in which the first column control circuitry is used to operate bit lines in a first plane in the memory die and the second column control circuitry is used to operate bit lines in a second plane in the memory die.

FIG. 10 depicts a variation of the floorplan of FIG. 9A in which the first column control circuitry 210(1) is used to operate bit lines in a first plane in the memory die 200 and the second column control circuitry 210(2) is used to operate bit lines in a second plane in the memory die 200. Referring to FIG. 10 the first column control circuitry 210(1) is entirely in either unit 500(1) or 500(2). However, a portion of second column control circuitry 210(2) is in either unit 500(3) or 500(4), which allows some of the system control circuitry 260 to be placed into either unit 500(1) or 500(2).

Similar to an embodiment depicted in FIG. 9A, an embodiment depicted in FIG. 10 may simplify the routing. For example, with reference again to FIG. 10, arrow 1052 shows possible routing on the control die 204 between the I/O 508 and system control logic 260 in unit 500(3) without crossing any region having column control circuitry 210. Arrow 1054 shows possible routing on the control die 204 between system control logic 260 in unit 500(3) without crossing any region having column control circuitry 210. Arrow 1056 shows possible routing on the control die 204 between the I/O 508 and system control logic 260 in unit 500(4) without crossing any region having column control circuitry 210. Arrow 1058 shows possible routing on the control die 204 between system control logic 260 within unit 500(4) without crossing any region having column control circuitry 210. Therefore routing is simplified. Moreover cost is saved. Furthermore, size of the control die 204 may be reduced.

In view of the foregoing, an embodiment includes an apparatus comprising a first semiconductor die attached to a second semiconductor die. The first semiconductor die comprises a plane having NAND strings, each NAND string extending in a z-direction. The first semiconductor die comprises bit lines extending across the plane. The bit lines occupy an x-y region with each bit line extending in an x-direction. The bit lines comprise a first set of bit lines and a second set of bit lines. The second semiconductor die comprises first column control circuitry connected to and configured to control the first set of bit lines. The first column control circuitry occupies a first x-y sub-region parallel to a portion of the x-y region. The second semiconductor die comprises second column control circuitry connected to and configured to control the second set of bit lines. The second column control circuitry occupies a second x-y sub-region parallel to a portion of the x-y region. At least of portion of the second column control circuitry is stacked in the x-direction with at least of portion of the first column control circuitry. The system control circuitry is configured to control the first column control circuitry and the second column control circuitry. The system control circuitry occupies a third x-y sub-region parallel to a portion of the x x-y region. The first x-y sub-region, the second x-y sub-region, and the third x-y sub-region are non-overlapping. At least a portion of the system control circuitry extends in the x-direction across the stacked first and second column control circuitry.

In an embodiment, the second set of bit lines reside above (in the z-direction) the portion of the system control circuitry that extends in the x-direction across the stacked first and second column control circuitry.

In an embodiment, the apparatus further comprises first electrical connections each having a first end connected to circuitry in the first column control circuitry. Each bit line in the first set of bit lines is connected to a second end of one of the first electrical connections. The apparatus further comprises second electrical connections each having a first end connected to circuitry in the second column control circuitry. Each bit line in the second set of bit lines is connected to a second end of one of the second electrical connections. Each second electrical connection has a bit line bridge in a metal layer in first semiconductor die adjacent to the bit lines. Each bit line bridge has a first segment above the second column control circuitry and a second segment above the portion of the system control circuitry that extends in the x-direction across the stacked first and second column control circuitry.

In an embodiment, the first electrical connections each comprise first bond pad pairs that bond the first semiconductor die to the second semiconductor die. The second electrical connections each comprise second bond pad pairs that bond the first semiconductor die to the second semiconductor die.

In an embodiment, the first set of bit lines and the second set of bit lines contain approximately the same number of bit lines.

In an embodiment, the first x-y sub-region is substantially the same size as the second x-y sub-region.

In an embodiment, the first set of bit lines contain a substantially greater number of bit lines than the second set of bit lines.

In an embodiment, the first x-y sub-region is substantially larger than the second x-y sub-region.

In an embodiment, the plane is a first plane, the x-y region is a first x-y region, and the system control circuitry is first system control circuitry. The first semiconductor die further comprises a second plane having NAND strings, each NAND string extending in the z-direction. The first semiconductor die further bit lines extending across the second plane in the x-direction and occupying a second x-y region, the bit lines that extend across the second plane comprising a third set of bit lines and a fourth set of bit lines. The second semiconductor die further comprises third column control circuitry connected to and configured to control the third set of bit lines. The third column control circuitry occupies a fourth x-y sub-region parallel to a portion of the second x-y region. The second semiconductor die further comprises fourth column control circuitry connected to and configured to control the fourth set of bit lines, the fourth column control circuitry occupying a fifth x-y sub-region parallel to a portion of the second x-y region. At least of portion of the fourth column control circuitry is stacked in the x-direction with at least of portion of the third column control circuitry. The second semiconductor die further comprises second system control circuitry configured to control the third column control circuitry and the fourth column control circuitry. The second system control circuitry occupies a sixth x-y sub-region parallel to a portion of the second x-y region, wherein the fourth x-y sub-region, the fifth x-y sub-region, and the sixth x-y sub-region are non-overlapping. At least a portion of the second system control circuitry extends in the x-direction across the stacked third and fourth column control circuitry.

In an embodiment, the second semiconductor die further comprises an input/output pad adjacent to the second system control circuitry. The second semiconductor die further comprises routing connections between the input/output pad and the first system control circuitry that pass above the portion of the second system control circuitry that extends in the x-direction across the stacked third and fourth column control circuitry.

In an embodiment, the second semiconductor die further comprises routing connections between the first system control circuitry and the second system control circuitry that pass above the portion of the second system control circuitry that extends in the x-direction across the stacked third and fourth column control circuitry.

One embodiment includes a method comprises providing a memory die comprising: a plane having a three-dimensional memory structure comprising a stack of alternating conductive and dielectric layers, the three-dimensional memory structure having NAND memory cells extending in a z-direction through the stack; and bit lines extending across the plane in an x-direction, the bit lines comprising a first set of bit lines and a second set of bit lines, the bit lines adjacent the three-dimensional memory structure. The method further comprises providing a logic die bonded to the memory die. The logic die comprises first column control circuitry connected to and configured to control the first set of bit lines, the first column control circuitry occupying a first x-y region below the three-dimensional memory structure. The logic die comprises second column control circuitry connected to and configured to control the second set of bit lines, the second column control circuitry occupying a second x-y region below the three-dimensional memory structure, at least of portion of the second column control circuitry stacked in the x-direction with at least of portion of the first column control circuitry. The logic die comprises system control circuitry configured to control the first column control circuitry and the second column control circuitry, the system control circuitry occupying a third x-y region below the three-dimensional memory structure, wherein the first x-y region, the second x-y region, and the third x-y region are non-overlapping, the third x-y region having at least a portion that spans an entire side of the first and the second x-y regions in the x-direction.

One embodiment includes a non-volatile storage device comprising a first semiconductor die bonded to a second semiconductor die. The first semiconductor die has one or more planes having NAND strings, each NAND string extending in a z-direction. The first semiconductor die has bit lines extending across the one or planes in an x-direction, the bit lines comprising a first set of bit lines and a second set of bit lines. The second semiconductor die comprises first column control circuitry configured to control the first set of bit lines, the first column control circuitry occupying a first x-y region below a first plane of the one or more planes. The second semiconductor die comprises second column control circuitry configured to control the second set of bit lines, the second column control circuitry occupying a second x-y region below one or more of the planes. The second semiconductor die comprises peripheral circuitry occupying a third x-y region below the one or more planes. The first x-y region, the second x-y region, and the third x-y region are non-overlapping. The non-volatile storage device comprises first electrical connections each having a first end connected to circuitry in the first column control circuitry, each bit line in the first set of bit lines connected above (in the z-direction) the first column control circuitry to a second end of one of the first electrical connections. The non-volatile storage device comprises second electrical connections each having a first end connected to circuitry in the second column control circuitry, each bit line in the second set of bit lines connected above (in the z-direction) the peripheral circuitry to a second end of one of the second electrical connections, each second electrical connection having a bit line bridge in a metal layer in the first semiconductor die, each bit line bridge having a first segment above the second column control circuitry and a second segment above the peripheral circuitry.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a first semiconductor die comprising:
   a plane having NAND strings, each NAND string extending in a z-direction; and
   bit lines extending across the plane, the bit lines occupying an x-y region, each bit line extending in an x-direction, the bit lines comprising a first set of bit lines and a second set of bit lines; and
a second semiconductor die attached to the first semiconductor die, wherein the second semiconductor die comprises:
   first column control circuitry connected to and configured to control the first set of bit lines, the first column control circuitry occupying a first x-y sub-region parallel to a portion of the x-y region;
   second column control circuitry connected to and configured to control the second set of bit lines, the second column control circuitry occupying a second x-y sub-region parallel to a portion of the x-y region, at least of portion of the second column control circuitry stacked in the x-direction with at least of portion of the first column control circuitry; and
   system control circuitry configured to control the first column control circuitry and the second column control circuitry, the system control circuitry occupying a third x-y sub-region parallel to a portion of the x-y region, wherein the first x-y sub-region, the second x-y sub-region, and the third x-y sub-region are non-overlapping, wherein at least a portion of the system control circuitry extends in the x-direction across the stacked first and second column control circuitry.

2. The apparatus of claim 1, wherein:
the second set of bit lines reside above (in the z-direction) the portion of the system control circuitry that extends in the x-direction across the stacked first and second column control circuitry.

3. The apparatus of claim 2, further comprising:
first electrical connections each having a first end connected to circuitry in the first column control circuitry, each bit line in the first set of bit lines connected to a second end of one of the first electrical connections; and
second electrical connections each having a first end connected to circuitry in the second column control circuitry, each bit line in the second set of bit lines connected to a second end of one of the second electrical connections, each second electrical connection having a bit line bridge in a metal layer in first semiconductor die adjacent to the bit lines, each bit line bridge having a first segment above the second column control circuitry and a second segment above the portion of the system control circuitry extends in the x-direction across the stacked first and second column control circuitry.

4. The apparatus of claim 3, wherein:
the first electrical connections each comprise first bond pad pairs that bond the first semiconductor die to the second semiconductor die; and
the second electrical connections each comprise second bond pad pairs that bond the first semiconductor die to the second semiconductor die.

5. The apparatus of claim 1, wherein:
the first set of bit lines and the second set of bit lines contain approximately the same number of bit lines.

6. The apparatus of claim 1, wherein:
the first x-y sub-region is substantially the same size as the second x-y sub-region.

7. The apparatus of claim 1, wherein:
the first set of bit lines contain a substantially greater number of bit lines than the second set of bit lines.

8. The apparatus of claim 1, wherein:
the first x-y sub-region is substantially larger than the second x-y sub-region.

9. The apparatus of claim 1, wherein:
the plane is a first plane, the x-y region is a first x-y region, and the system control circuitry is first system control circuitry;
the first semiconductor die further comprises:
   a second plane having NAND strings, each NAND string extending in the z-direction; and
   bit lines extending across the second plane in the x-direction and occupying a second x-y region, the bit lines that extend across the second plane comprising a third set of bit lines and a fourth set of bit lines; and
the second semiconductor die further comprises:
   third column control circuitry connected to and configured to control the third set of bit lines, the third column control circuitry occupying a fourth x-y sub-region parallel to a portion of the second x-y region;
   fourth column control circuitry connected to and configured to control the fourth set of bit lines, the fourth column control circuitry occupying a fifth x-y sub-region parallel to a portion of the second x-y region, at least of portion of the fourth column control circuitry stacked in the x-direction with at least of portion of the third column control circuitry; and
   second system control circuitry configured to control the third column control circuitry and the fourth column control circuitry, the second system control circuitry occupying a sixth x-y sub-region parallel to a portion of the second x-y region, wherein the fourth x-y sub-region, the fifth x-y sub-region, and the sixth x-y sub-region are non-overlapping, wherein at least a portion of the second system control circuitry extends in the x-direction across the stacked third and fourth column control circuitry.

10. The apparatus of claim 9, wherein the second semiconductor die further comprises:
an input/output pad adjacent to the second system control circuitry; and
routing connections between the input/output pad and the first system control circuitry that pass above the portion of the second system control circuitry that extends in the x-direction across the stacked third and fourth column control circuitry.

11. The apparatus of claim 9, wherein the second semiconductor die further comprises:
routing connections between the first system control circuitry and the second system control circuitry that pass above the portion of the second system control circuitry that extends in the x-direction across the stacked third and fourth column control circuitry.

12. A method comprising:
   providing a memory die comprising:
      a plane having a three-dimensional memory structure comprising a stack of alternating conductive and dielectric layers, the three-dimensional memory structure having NAND memory cells extending in a z-direction through the stack; and
      bit lines extending across the plane in an x-direction, the bit lines comprising a first set of bit lines and a second set of bit lines, the bit lines adjacent the three-dimensional memory structure; and
   providing a logic die bonded to the memory die, wherein the logic die comprises:
      first column control circuitry connected to and configured to control the first set of bit lines, the first column control circuitry occupying a first x-y region below the three-dimensional memory structure;
      second column control circuitry connected to and configured to control the second set of bit lines, the second column control circuitry occupying a second x-y region below the three-dimensional memory structure, at least of portion of the second column control circuitry stacked in the x-direction with at least of portion of the first column control circuitry; and
      system control circuitry configured to control the first column control circuitry and the second column control circuitry, the system control circuitry occupying a third x-y region below the three-dimensional memory structure, wherein the first x-y region, the second x-y region, and the third x-y region are non-overlapping, the third x-y region having at least a portion that spans an entire side of the first and the second x-y regions in the x-direction.

13. A non-volatile storage device comprising:
   a first semiconductor die comprising:
      one or more planes having NAND strings, each NAND string extending in a z-direction; and
      bit lines extending across the one or planes in an x-direction, the bit lines comprising a first set of bit lines and a second set of bit lines; and
   a second semiconductor die bonded to the first semiconductor die, wherein the second semiconductor die comprises:
      first column control circuitry configured to control the first set of bit lines, the first column control circuitry occupying a first x-y region below a first plane of the one or more planes;
      second column control circuitry configured to control the second set of bit lines, the second column control circuitry occupying a second x-y region below one or more of the planes; and
      peripheral circuitry occupying a third x-y region below the one or more planes, wherein the first x-y region, the second x-y region, and the third x-y region are non-overlapping;
   first electrical connections each having a first end connected to circuitry in the first column control circuitry, each bit line in the first set of bit lines connected above (in the z-direction) the first column control circuitry to a second end of one of the first electrical connections; and
   second electrical connections each having a first end connected to circuitry in the second column control circuitry, each bit line in the second set of bit lines connected above (in the z-direction) the peripheral circuitry to a second end of one of the second electrical connections, each second electrical connection having a bit line bridge in a metal layer in the first semiconductor die, each bit line bridge having a first segment above the second column control circuitry and a second segment above the peripheral circuitry.

14. The non-volatile storage device of claim 13, wherein:
   each bit line bridge extends in a y-direction.

15. The non-volatile storage device of claim 14, wherein:
   the first set of bit lines and the second set of bit lines reside in the same plane in the first semiconductor die.

16. The non-volatile storage device of claim 13, wherein:
   the first set of bit lines resides in a first plane in the first semiconductor die; and
   the second set of bit lines resides in a second plane in the first semiconductor die.

17. The non-volatile storage device of claim 16, wherein:
   each bit line bridge extends in the x-direction.

18. The non-volatile storage device of claim 13, wherein the first set of bit lines and the second set of bit lines extend across a first plane in the first semiconductor, the peripheral circuitry is first peripheral circuitry, and the bit line bridges are first bit line bridges;
   the bit lines comprise a third set of bit lines and a fourth set of bit lines that extend across a second plane of the one or more planes;
   the second semiconductor die further comprises:
      third column control circuitry configured to control the third set of bit lines, the third column control circuitry occupying a fourth x-y region below the second plane;
      fourth column control circuitry configured to control the fourth set of bit lines, the fourth column control circuitry occupying a fifth x-y region below the second plane; and
      second peripheral circuitry occupying a sixth x-y region below the second plane, wherein the fourth x-y region, the fifth x-y region, and the sixth x-y region are non-overlapping;
   third electrical connections each having a first end connected to circuitry in the third column control circuitry, each bit line in the third set of bit lines connected above the fourth x-y region to a second end of one of the third electrical connections; and
   fourth electrical connections each having a first end connected to circuitry in the fourth column control circuitry, each bit line in the fourth set of bit lines connected in the sixth x-y region to a second end of one of the fourth electrical connections, each fourth electrical connection having a second bit line bridge in the metal layer in the first semiconductor die, each second bit line bridge having a third segment above the fifth x-y region and a fourth segment above the sixth x-y region, wherein the fourth segment each second bit line bridge resides above the second peripheral circuitry.

19. The non-volatile storage device of claim 18, wherein second semiconductor die further comprises:
   an input/output pad adjacent to a y-direction border of the second peripheral circuitry; and
   routing connections between the input/output pad and the first peripheral circuitry that pass above a portion of the second peripheral circuitry below the fourth set of bit lines.

20. The non-volatile storage device of claim 13, wherein:
the first electrical connections each comprise first bond pad pairs that bond the first semiconductor die to the second semiconductor die; and
the second electrical connections each comprise second bond pad pairs that bond the first semiconductor die to the second semiconductor die.

\* \* \* \* \*